United States Patent
Liu et al.

(10) Patent No.: US 12,002,424 B2
(45) Date of Patent: Jun. 4, 2024

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guo Liu, Beijing (CN); Shilong Wang, Beijing (CN); Tiaomei Zhang, Beijing (CN); Jidong Li, Beijing (CN); Tong Niu, Beijing (CN); Siyu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/639,041

(22) PCT Filed: Apr. 30, 2021

(86) PCT No.: PCT/CN2021/091650
§ 371 (c)(1),
(2) Date: Feb. 28, 2022

(87) PCT Pub. No.: WO2022/227055
PCT Pub. Date: Nov. 3, 2022

(65) Prior Publication Data
US 2024/0038165 A1    Feb. 1, 2024

(51) Int. Cl.
*G09G 3/3233* (2016.01)
*G09G 3/3266* (2016.01)
*G09G 3/3275* (2016.01)

(52) U.S. Cl.
CPC ......... *G09G 3/3233* (2013.01); *G09G 3/3266* (2013.01); *G09G 3/3275* (2013.01); *G09G 2320/0233* (2013.01)

(58) Field of Classification Search
None
See application file for complete search history.

(56) References Cited

U.S. PATENT DOCUMENTS

2006/0146242 A1\* 7/2006 Kim ................. G02F 1/134336
349/129
2009/0102753 A1    4/2009 Yamashita et al.
(Continued)

FOREIGN PATENT DOCUMENTS

| CN | 104332561 A1 | 2/2015 |
| CN | 105280684 A  | 1/2016 |

(Continued)

OTHER PUBLICATIONS

Partial Supplementary European Search Report from European Application No. 21938529.1; Mailing Date: Feb. 5, 2024.

*Primary Examiner* — Christopher J Kohlman
(74) *Attorney, Agent, or Firm* — Dilworth & Barrese, LLP.; Michael J. Musella, Esq.

(57) ABSTRACT

A display substrate and a display device are provided. The display substrate includes a base substrate and a plurality of subpixels provided on the base substrate. Each subpixel includes a pixel circuit. The plurality of subpixels include first subpixels. The display substrate further includes power lines. Each power line is configured to provide a first supply voltage for the corresponding first subpixels, the power line is provided on a side of the pixel electrode of the first subpixel near the base substrate, and the power line includes a power line main body and a power line protrusion protruded from the power line main body. The power line protrusion is at least partially overlapped with the pixel (Continued)

electrode of the first subpixel in a direction perpendicular to the base substrate. The display substrate can effectively improve the display quality.

20 Claims, 14 Drawing Sheets

(56) References Cited

U.S. PATENT DOCUMENTS

| | | |
|---|---|---|
| 2015/0001492 A1 | 1/2015 | Lee |
| 2016/0372711 A1 | 12/2016 | Song et al. |
| 2017/0077200 A1 | 3/2017 | Mou et al. |
| 2017/0358262 A1 | 12/2017 | Moon |
| 2018/0261655 A1 | 9/2018 | Lee et al. |
| 2020/0176531 A1 | 6/2020 | Baek et al. |
| 2020/0328264 A1 | 10/2020 | Wu et al. |
| 2020/0335561 A1 | 10/2020 | Huiang et al. |
| 2021/0035496 A1 | 2/2021 | Cho et al. |
| 2022/0383811 A1* | 12/2022 | Liu ...................... H10K 59/123 |
| 2023/0028604 A1 | 1/2023 | Ma et al. |

FOREIGN PATENT DOCUMENTS

| | | |
|---|---|---|
| CN | 108231860 A | 6/2018 |
| CN | 108695370 A | 10/2018 |
| CN | 109671760 A | 4/2019 |
| CN | 110047898 A | 7/2019 |
| CN | 110853531 A1 | 2/2020 |
| CN | 111029387 A | 4/2020 |
| CN | 111509014 A | 8/2020 |
| CN | 111564120 A | 8/2020 |
| CN | 111584757 A | 8/2020 |
| CN | 111725281 A | 9/2020 |
| CN | 111952342 A | 11/2020 |
| CN | 112310152 A | 2/2021 |
| KR | 20180003363 A | 1/2018 |

* cited by examiner

30

DISPLAY SUBSTRATE AND DISPLAY DEVICE

TECHNICAL FIELD

Embodiments of the present disclosure relate to a display substrate and a display device.

BACKGROUND

The organic light-emitting diode (OLED) display has become one of the main new-generation displays due to the advantages of active emitting, high contrast, rapid response speed, light and thin property and the like. Along with the rapid development of high-resolution products, higher requirement is put forward to the structural design of the display substrate of the display, for instance, the arrangement of pixels and signal lines.

SUMMARY

At least an embodiment of the present disclosure provides a display substrate, comprising: a base substrate; and a plurality of subpixels on the base substrate. Each of the plurality of subpixels incudes a pixel circuit which is configured to drive a light-emitting element corresponding to the each of the plurality of subpixels, the pixel circuits of the plurality of subpixels are arranged in an array along a first direction and a second direction, the first direction and the second direction are different; the each of the plurality of subpixels further comprises a pixel electrode which is a first electrode of the light-emitting element corresponding to the each of the plurality of subpixels, the pixel electrode and the pixel circuit of the each of the plurality of subpixels are electrically connected with each other; each pixel circuit comprises a drive subcircuit, a data write subcircuit, and a compensation subcircuit, the drive subcircuit comprises a control terminal, a first terminal, and a second terminal and the drive subcircuit is configured to be connected with the light-emitting element and control a driving current flowing across the light-emitting element; the data write subcircuit is connected with the driving subcircuit and the data write subcircuit is configured to write a data signal into the first terminal of the driving subcircuit in response to a first scanning signal; the compensation subcircuit is connected with the driving subcircuit and configured to perform threshold compensation on the driving subcircuit in response to a second scanning signal; the plurality of subpixels comprise first subpixels; the display substrate further comprises power lines which are configured to provide a first supply voltage for the first subpixels; each power line is provided on one side of the pixel electrode of a corresponding first subpixel near the base substrate, and the each power line comprises a power line main body extending along the second direction and a power line protrusion protruded from the power line main body, and the power line protrusion and the pixel electrode of the first subpixel are at least partially overlapped in a direction perpendicular to the base substrate.

In some example, the first subpixel further comprises a first connecting electrode and a second connecting electrode; the first connecting electrode, the second connecting electrode, and the power line are arranged in the same layer and insulated from each other; the first connecting electrode is respectively electrically connected with the pixel circuit and the pixel electrode of the first subpixel so as to electrically connect the pixel circuit and the pixel electrode of the first subpixel; the second connecting electrode is respectively electrically connected with the control terminal of the driving subcircuit and the compensation subcircuit of the first subpixel so as to electrically connect the compensation subcircuit and the control terminal of the driving subcircuit of the first subpixel; and the first connecting electrode and the second connecting electrode are respectively at least partially overlapped with the pixel electrode of the first subpixel in the direction perpendicular to the base substrate.

In some example, the power line protrusion is protruded from the power line main body along the first direction and provided between the first connecting electrode and the second connecting electrode in the second direction; and the power line protrusion is respectively at least partially overlapped with the first connecting electrode and the second connecting electrode in the second direction.

In some example, in the second direction, the proportion ratio between a maximum dimension of the power line protrusion and a minimum spacing between the first connecting electrode and the second connecting electrode is 0.4-0.8.

In some example, the pixel electrode of the first subpixel comprises a first electrode main body and a first connecting part, the first electrode main body is configured to contact a light-emitting layer of the light-emitting element corresponding to the first subpixel, the first connecting part of the pixel electrode is electrically connected with the first connecting electrode through a first via hole, and the first electrode main body and the first via hole are not overlapped with each other in the direction perpendicular to the base substrate.

In some example, the first electrode main body is a rectangle, and a length and a width of the rectangle are respectively parallel to the first direction and the second direction.

In some example, the compensation subcircuit comprises a control electrode, a first electrode, and a second electrode, the first electrode and the second electrode of the compensation subcircuit are respectively electrically connected with the second terminal and the control terminal of the driving subcircuit; the first electrode of the compensation subcircuit comprises conducted semiconductor materials; and the power line protrusion and the first electrode of the compensation subcircuit are not overlapped in the direction perpendicular to the base substrate.

In some example, the plurality of subpixels further comprise second subpixels, and the second subpixels and the first subpixels are adjacent to each other in the first direction; the display substrate further comprises first data lines and second data lines extending along the second direction, the first data lines and the second data lines are respectively configured to provide data signals for the first subpixels and the second subpixels; each first data line and a corresponding second data line are respectively provided on two sides of a corresponding power line, and the second data line and the pixel electrode of the first subpixel are at least partially overlapped in the direction perpendicular to the base substrate.

In some example, in the first direction, the power line protrusion is provided between the power line main body and the second data line.

In some example, the pixel electrode of the second subpixel is respectively at least partially overlapped with the power line and the second data line in the direction perpendicular to the base substrate.

In some example, the power line comprises a bending part which is bent towards the second data line to form a depressed area, and the bending part is at least partially overlapped with the pixel electrode of the second subpixel in the direction perpendicular to the base substrate.

In some example, in the second direction, a minimum spacing between the power line protrusion and the bending part is greater than the minimum spacing between the pixel electrode of the first subpixel and the pixel electrode of the second subpixel.

In some example, the pixel electrode of the second subpixel comprises a second electrode main body which is a rectangle; and a projection of an orthographic projection of a geometrical center of the rectangle on the plane of the power line, on the power line along the second direction is on the bending part.

In some example, the plurality of subpixels also comprise adjacent subpixels of the first subpixels adjacent to each other in the second direction; the first data line is configured to be connected with the data subcircuits of the adjacent subpixels through a second via hole to provide a data signal for the third subpixels; the first data line comprises a data line main body extending along the second direction and a data line protrusion extending out from the data line main body, the data line protrusion and the second via hole are at least partially overlapped with each other in the direction perpendicular to the base substrate; and the data line protrusion is protruded towards the depressed area of the bending part of the power line.

In some example, the power line comprises a plurality of power line protrusions and a plurality of bending parts; and the plurality of power line protrusions and the plurality of bending parts are alternately arranged in the second direction.

In some example, the plurality of subpixels comprise a plurality of first subpixels, a plurality of second subpixels, and a plurality of third subpixels, and the first subpixels, the second subpixels and the third subpixels are respectively configured to emit light of different colors; and in the second direction, pixel electrodes of the first subpixels and pixel electrodes of the second subpixels are alternately arranged; or pixel electrodes of the third subpixels are sequentially arranged.

In some example, in the first direction, the pixel electrodes of the first subpixels and the pixel electrodes of the third subpixels are alternately arranged; or the pixel electrodes of the second subpixels and the pixel electrodes of the third subpixels are alternately arranged.

In some example, the pixel electrodes of the plurality of second subpixels comprise first shape electrodes and second shape electrodes, and the pixel electrodes of the plurality of third subpixels comprise third shape electrodes and fourth shape electrodes; the first shape electrodes and the second shape electrodes are alternately arranged in the first direction or the second direction; and the third shape electrodes and the fourth shape electrodes are alternately arranged in the first direction or the second direction.

In some example, the pixel electrodes of the plurality of second subpixels are arranged in a pixel electrode array in the first direction and the second direction, the pixel electrodes of the plurality of second subpixels comprise first shape electrodes, second shape electrodes, third shape electrodes, and fourth shape electrodes; the pixel electrode array comprises a first pixel electrode array and a second pixel electrode array, in the first pixel electrode array, the first shape electrodes and the second shape electrodes are alternately arranged in the second direction, and in the second pixel electrode array, the third shape electrodes and the fourth shape electrodes are alternately arranged in the second direction.

In some example, the compensation subcircuit comprises a compensation transistor; the compensation transistor comprises a first gate electrode, a second gate electrode, and a conduction region disposed between the first gate electrode and the second gate electrode; the conduction region comprises conducted semiconductor materials.

In some example, the plurality of subpixels further comprise second subpixels and third subpixels; and the first subpixel, the second subpixel, and the third subpixel are respectively configured to emit light of different color.

In some example, the second subpixels and the first subpixels are disposed in adjacent pixel rows and adjacent pixel columns; and the conduction region of the compensation transistor of each first subpixel is at least partially overlapped with the pixel electrode of a corresponding second subpixel in the direction perpendicular to the base substrate.

In some example, the plurality of subpixels further comprise fourth subpixels; the fourth subpixels and the second subpixels are adjacent to each other in the second direction and configured to emit light of a same color; in the direction perpendicular to the base substrate, the conduction region of the compensation transistor of each second subpixel is at least partially overlapped with the pixel electrode of a corresponding fourth subpixel or the pixel electrode of a corresponding third subpixel; and the third subpixels and the second subpixels are disposed in adjacent pixel rows and adjacent pixel columns.

In some example, the plurality of subpixels also comprise fifth subpixels; the fifth subpixels and the third subpixels are adjacent to each other in the second direction and configured to emit light of the same color; and the conduction region of the compensation transistor of each third subpixel is at least partially overlapped with the pixel electrode of a corresponding fifth subpixel in the direction perpendicular to the base substrate.

At least an embodiment of the present disclosure also provides a display substrate, comprising: a base substrate; and a plurality of subpixels distributed in an array on the base substrate. Each of the plurality of subpixels comprises a pixel circuit which is configured to drive a light-emitting element corresponding to each of the plurality of subpixels; the pixel circuits of the plurality of subpixels are arranged along a first direction and a second direction, the first direction and the second direction are different; each of the plurality of subpixels also comprises a pixel electrode which is a first electrode of the light-emitting element corresponding to each subpixel, and the pixel electrode and the pixel circuit of each subpixel is electrically connected with each other; each pixel circuit comprises a driving subcircuit, a data write subcircuit, and a compensation subcircuit; the driving subcircuit comprises a control terminal, a first terminal, and a second terminal, and is configured to be connected with the light-emitting element and control the driving current flowing across the light-emitting element; the data write subcircuit is connected with the driving subcircuit and configured to write a data signal into the first terminal of the driving subcircuit in response to a first scanning signal; the compensation subcircuit is connected with the driving subcircuit and configured to perform threshold compensation on the driving subcircuit in response to a second scanning signal; the plurality of subpixels are divided into a plurality of pixel groups, each of the plurality of pixel groups comprises a first subpixel, a second subpixel, and a third subpixel, which are respectively configured to emit light of different colors; the plurality of pixel groups comprise first pixel groups and second pixel groups adjacent to each other in the first direction, pixel electrodes of at least one subpixel in the first pixel group and corresponding subpixel in the second pixel group have different shapes; and pixel electrodes of at least one subpixel in the first pixel group and corresponding subpixel in the second pixel group have same shape.

In some example, pixel electrodes of the first subpixel in the first pixel group and the first subpixel in the second pixel group have same shape; and pixel electrodes of the second subpixel and the third subpixel in the first pixel group have different shapes from those of pixel electrodes of the second subpixel and the third subpixel in the second pixel group.

In some example, the compensation subcircuit comprises a compensation transistor, the compensation transistor comprises a first gate electrode, a second gate electrode, and a conduction region disposed between the first gate electrode and the second gate electrode, and the conduction region comprises conducted semiconductor materials; the plurality of pixel groups also comprise third pixel groups and fourth pixel groups adjacent to each other in the first direction, the third pixel groups and the first pixel groups are adjacent to each other in the second direction, and the fourth pixel groups and the second pixel groups are adjacent to each other in the second direction; and in a direction perpendicular to the base substrate, the conduction regions of the compensation transistors of the first subpixels in the third pixel groups are at least partially overlapped with the pixel electrodes of the second subpixels in the first pixel groups, respectively.

In some example, in the direction perpendicular to the base substrate, the conduction regions of the compensation transistors of the second subpixels and the third subpixels in the third pixel groups are respectively overlapped with the pixel electrodes of the third subpixels in the first pixel groups.

In some example, each pixel electrode of the third subpixels in the first pixel groups comprises an electrode main body and a first electrode protrusion and a second electrode protrusion extending out from the third electrode main body; and in the direction perpendicular to the base substrate, the first protrusions and the second protrusions are respectively at least partially overlapped with the conduction regions of the compensation transistors of the second subpixels and the third subpixels in the third pixel groups.

In some example, the conduction regions of the compensation transistors of each first subpixel and each second subpixel in the fourth pixel groups are at least partially overlapped with corresponding pixel electrodes of the second subpixels in the second pixel groups.

In some example, each pixel electrode of the second subpixels in the second pixel groups comprises an electrode main body and a third electrode protrusion and a fourth electrode protrusion extending out from the electrode main body; and in the direction perpendicular to the base substrate, the third electrode protrusions and the fourth electrode protrusions are respectively at least partially overlapped with the conduction regions of the compensation transistors of the first subpixels and the second subpixels in the fourth pixel groups.

In some example, a minimum spacing between the electrode main bodies of the pixel electrodes of the third subpixels in the first pixel groups and the third pixel groups is smaller than a minimum spacing between the electrode main bodies of the pixel electrodes of the third subpixels in the second pixel groups and the fourth pixel groups.

At least an embodiment of the present disclosure also provides a display device, comprising the display substrate of any above embodiments.

BRIEF DESCRIPTION OF THE DRAWINGS

Simple description is given below to the accompanying drawings of the embodiments to provide a clearer understanding to the technical proposals of the embodiments of the present disclosure. Apparently, the drawings described below only involve some embodiments of the present disclosure but are not intended to limit the present disclosure.

DETAILED DESCRIPTION

Figure 1A:
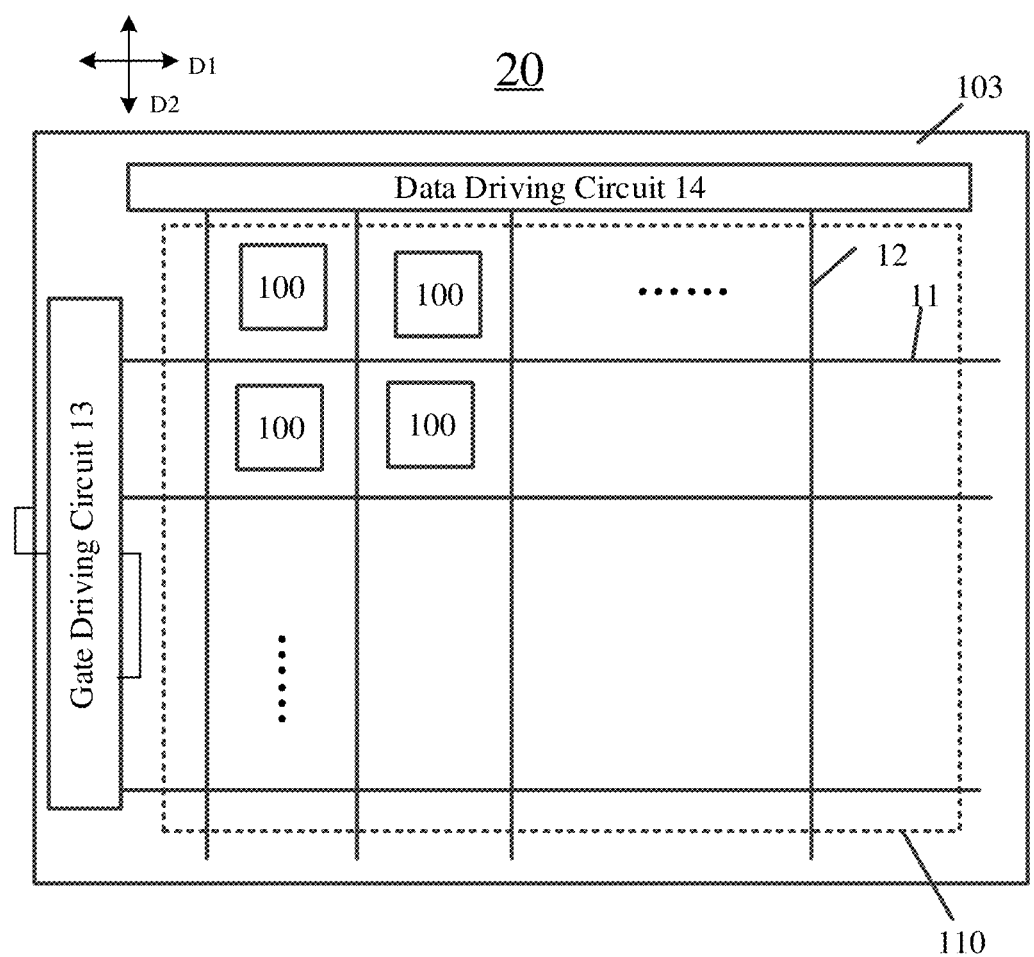
FIG. 1A is a first schematic diagram of the display substrate provided by at least one embodiment of the present disclosure.

To make the objective, technical solutions and advantages clearer, the technical solutions of the embodiments will be described in a clearly and fully understandable way in connection with the related drawings. It is apparent that the described embodiments are just a part but not all of the embodiments of the present disclosure. Based on the described embodiments herein, a person of ordinary skill in the art can obtain, without any creative work, other embodiment(s) which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present application, are not intended to represent any sequence, amount or importance, but for distinguishing various components. Also, the terms, such as "a," "an," "the," or the like, are not intended to limit the amount, but may be for indicating the existence of at lease one. Also, the terms, such as "comprise/comprising," "include/including," or the like are intended to specify that the elements or the objects before these terms encompass the elements or the objects and equivalents thereof listed after these terms, while not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right" or the like are only used to represent relative position relationship, and when the absolute position of the object which is described is changed, the relative position relationship may be changed accordingly.

The electrode flatness of the light-emitting elements has great effect on the luminous efficiency and the light-emitting quality of the light-emitting elements. For instance, in the top-emission mode, the luminous efficiency of the light-emitting element is relevant to the reflection index of a lower electrode (e.g., an anode) of the light-emitting element. If the lower electrode has insufficient flatness, the generated reflection light intensity will have a difference, resulting in the loss in the luminous efficiency, so that the display is prone to produce color cast, and then the display quality can be affected. Moreover, for instance, the unevenness of the lower electrode leads to the unevenness of luminescent materials contacting the lower electrode, which is also prone to cause the loss in the luminous efficiency of the luminescent materials and result in the color cast of the luminescent materials.

In order to improve the flatness of the lower electrode of the light-emitting element, the lower electrode is usually disposed on a planarization layer. However, the inventors have found that as the viscosity of the planarization layer is usually large, the planarization layer cannot flow to reach complete planarization, the flatness of the lower electrode of the light-emitting element is affected by the flatness of conductive layers below the electrode, particularly, it is affected by a conductive layer closest to the electrode.

At least one embodiment of the present disclosure provides a display substrate, which comprises a base substrate and a plurality of subpixels distributed on the base substrate in an array. Each of the plurality of subpixels includes a pixel circuit that is configured to drive a light-emitting element corresponding to each of the plurality of subpixel. The pixel circuits of the plurality of subpixels are arranged along a first direction and a second direction. The first direction and the second direction are different. Each of the plurality of subpixels also includes a pixel electrode that is a first electrode of the light-emitting element corresponding to each subpixel. The pixel electrode and the pixel circuit of each subpixel are electrically connected with each other. Each pixel circuit includes a driving subcircuit, a data write subcircuit and a compensation subcircuit. The driving subcircuit includes a control terminal, a first terminal, and a second terminal and is configured to be connected with the light-emitting element and control the driving current flowing across the light-emitting element. The data write subcircuit is connected with the driving subcircuit and configured to write a data signal into the first terminal of the driving subcircuit in response to a first scanning signal. The compensation subcircuit is connected with the driving subcircuit and configured to perform threshold compensation on the driving subcircuit in response to a second scanning signal. The plurality of subpixels include first subpixels. The display substrate also comprises first power lines. Each first power line is configured to provide a first supply voltage for the first subpixel, the first power line is disposed on a side of the pixel electrode of the first subpixel near the base substrate, and the first power line includes a power line main body extending along the second direction and a power line protrusion protruded from the power line main body. The power line protrusion is at least partially overlapped with the pixel electrode of the first subpixel in a direction perpendicular to the base substrate.

The display substrate provided by at least one embodiment of the present disclosure, by the arrangement of the power line protrusion below the pixel electrode, on one hand, the height of the pixel electrode can be increased and the unevenness caused by the depression of the pixel electrode at this position can be effectively decreased. In addition, because a stable supply voltage is loaded on the power line protrusion, compared to other conductive structures with voltage change or floating electrodes (virtual electrodes) with unstable voltage, the interference on other node voltage in the circuit is reduced by the arrangement of the power line protrusion on the power line as a height increased electrode.

As shown in FIG. 1A, a display substrate 20 comprises a display region 110 and a non-display region 103 outside the display region 110. For instance, the non-display region 103 is disposed at a peripheral area of the display region 110. The display substrate 20 comprises a plurality of subpixels 100 disposed in the display region 110. For instance, the plurality of subpixels are arranged in an array, for instance, the plurality of subpixels are arranged in a plurality of pixel rows and a plurality of pixel columns along a first direction D1 and a second direction D2. The first direction D1 and the second direction D2 are different, for instance, they are orthogonally intersection. For instance, the pixel rows and the pixel columns do not strictly extend along straight lines and may extend along curves (such as fold lines). The curve, as a whole, extends along the first direction D1 or the second direction D2.

Each subpixel includes a pixel circuit which drives the light-emitting element to emit light. The plurality of pixel circuits are arranged in an array along the first direction D1 and the second direction D2. For instance, the subpixels form pixel units according to the traditional RGB mode so as to realize full-color display. The arrangement mode of the subpixels and the mode of realizing full-color display are not limited in the present disclosure.

For instance, as shown in FIG. 1A, the display substrate 20 further comprises conductive wires (e.g., gate lines 11) extending along the first direction D1 and a plurality of conductive wires (e.g., data lines 12) extending along the second direction D2, the plurality of transversal conductive wires and the plurality of longitudinal conductive wires are disposed in the display region 110. The plurality of transversal conductive wires and the plurality of longitudinal conductive wires are intersected with each other to define a plurality of pixel regions in the display region 110. One subpixel 100 is correspondingly disposed in each pixel region. FIG. 1A only shows approximate positional relationships of the gate lines 11, the data lines 12, and the subpixels 100 in the display substrate, all of which can be specifically designed according to actual demands.

The pixel circuit is, for instance, an nTmC (n and m are positive integers) pixel circuit, such as a 2T1C (namely two transistors and one capacitor) pixel circuit, a 4T2C pixel circuit, a 5T1C pixel circuit, or a 7T1C pixel circuit. Moreover, in different embodiments, the pixel circuit may further include a compensation subcircuit. The compensation subcircuit includes an internal compensation subcircuit or an external compensation subcircuit, and the compensation subcircuit may include transistors, capacitors, etc. For instance, as required, the pixel circuit may further include a reset circuit, a light-emitting control subcircuit, a detection circuit, etc. For instance, the display substrate may also comprise gate driving subcircuits 13 and data driving subcircuits 14 disposed in the non-display region. The gate driving subcircuit 13 is connected with the pixel circuits through gate lines 11 to provide a variety of scanning signals. The data driving subcircuit 14 is connected with the pixel circuit through data lines 12 to provide data signals. The positional relationships of the gate driving subcircuit 13, the data driving subcircuit 14, the gate lines 11, and the data lines 12 in the display substrate as shown in FIG. 1A is only an example, actual arrangement positions can be designed as required.

For instance, the display substrate 20 may also comprise a control circuit (not shown). For instance, the control circuit is configured to control the data driving subcircuit 14 to apply the data signal and control the gate driving subcircuit to apply the scanning signal. One example of the control circuit is a timing control circuit (T-con). The control circuit may be in various forms, for instance, the control circuit includes a processor and a memory. The memory includes executable codes. The processor runs the executable codes to execute the above detection process.

For instance, the processor may be a central processing unit (CPU) or other types of processing devices having data handling capacity and/or instruction execution capability, for instance, may include a microprocessor, a programmable logic controller (PLC), etc.

For instance, the memory may include one or more computer program products. The computer program products may include various forms of computer readable storage media, e.g., volatile memories and/or nonvolatile memories. The volatile memory, for instance, may include a random-access memory (RAM) and/or a CACHE, etc. The nonvolatile memory, for instance, may include a read-only memory (ROM), a hard disk, a flash memory, etc. One or more computer program instructions may be stored on the computer readable storage medium. The processor may run expected functions of the program instruction. A variety of applications and a variety of data may also be stored in the computer readable storage medium.

Figure 1B:
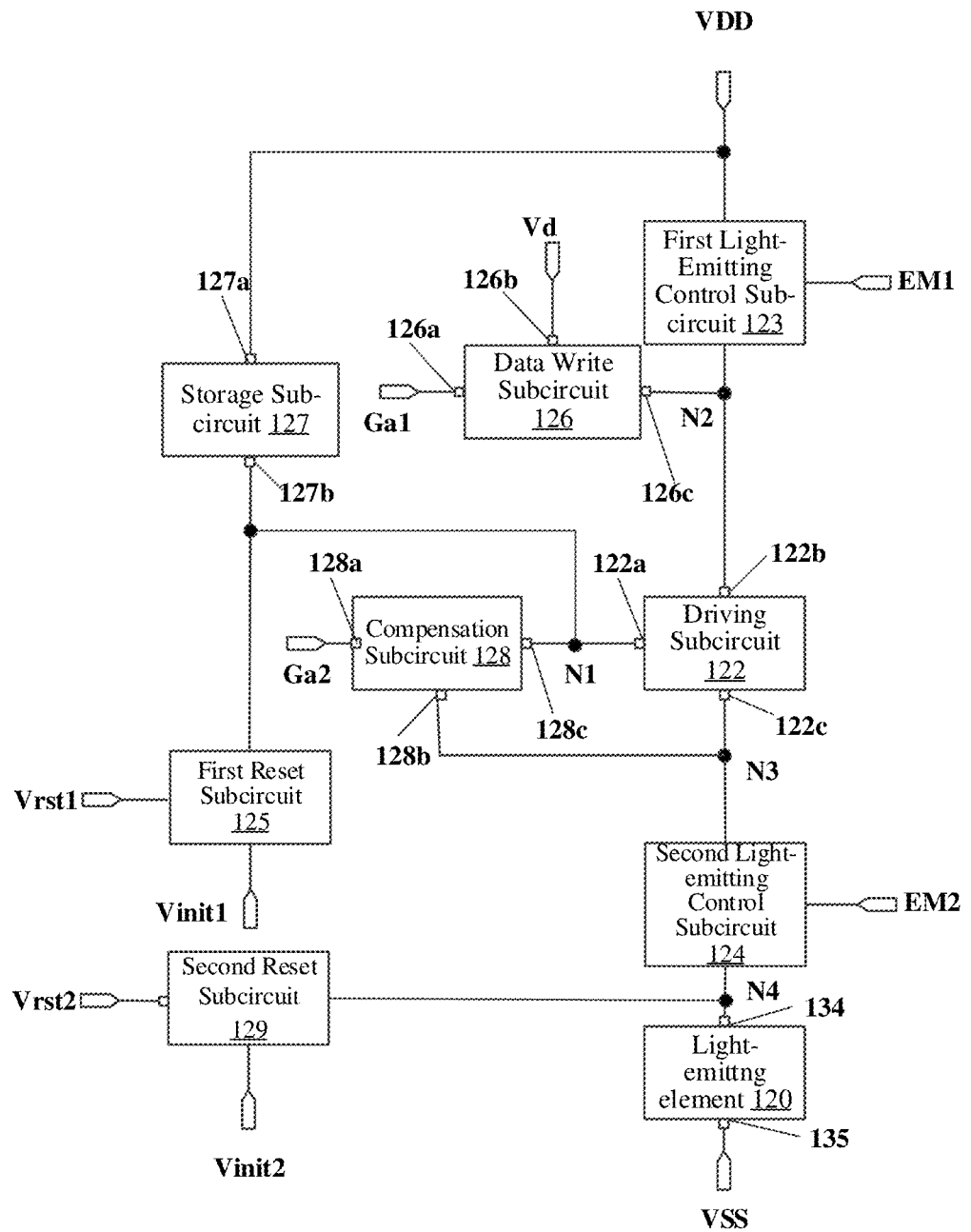
FIG. 1B is a first pixel circuit diagram of the display substrate provided by at least one embodiment of the present disclosure.

The pixel circuit may include a driving subcircuit, a data write subcircuit, a compensation subcircuit, and a storage subcircuit, and as required, the pixel circuit may also include a light-emitting control subcircuit, a reset circuit, etc. FIG. 1B is a schematic diagram of a pixel circuit.

As shown in FIG. 1B, the pixel circuit includes a driving subcircuit 122, a data write subcircuit 126, and a compensation subcircuit 128.

For instance, the driving subcircuit 122 includes a control terminal 122a, a first terminal 122b, and a second terminal 122c, and is configured to be connected with a light-emitting element 120 and control the driving current flowing across the light-emitting element 120. The control terminal 122a of the driving subcircuit 122 is connected with a first node N1. The first terminal 122b of the driving subcircuit 122 is connected with a second node N2. The second terminal 122c of the driving subcircuit 122 is connected with a third node N3.

For instance, the data write subcircuit 126 is connected with the driving subcircuit 122 and configured to write a data signal into the first terminal 122b of the driving subcircuit 122 in response to a first scanning signal. For instance, as shown in FIG. 1B, the data circuit 126 includes a control terminal 126a, a first terminal 126b, and a second terminal 126c. The control terminal 126a is configured to receive a first scanning signal Ga1. The first terminal 126b is configured to receive a data signal Vd. The second terminal 126c is connected with the first terminal 122b (namely the second node N2) of the driving subcircuit 122. The data write subcircuit 126 is configured to write the data signal Vd into the first terminal 122b of the driving subcircuit 122 in response to the first scanning signal Ga1. For instance, the first terminal 126b of the data write subcircuit 126 is connected with the data line 12 to receive the data signal Vd, and the control terminal 126a is connected with the gate line 11 used as a scanning line to receive the first scanning signal Ga1. For instance, in the data write and compensation stage, the data write subcircuit 126 may be switch on in response to the first scanning signal Ga1, so as to write the data signal into the first terminal 122b (the second node N2) of the driving subcircuit 122, and store the data signal, so as to generate the driving current that drives the light-emitting element 120 to emit light according to the data signal in the light-emitting stage, for instance.

For instance, the compensation subcircuit 128 is connected with the driving subcircuit 122 and configured to compensate the driving subcircuit 122 in response to a second scanning signal. The second scanning signal may be the same as or different from the first scanning signal. For instance, as shown in FIG. 1B, the compensation subcircuit 128 includes a control terminal 128a, a first terminal (namely a first electrode) 128b and a second terminal (namely a second electrode) 128c. The control terminal 128a of the compensation subcircuit 128 is configured to receive a second scanning signal Ga2. The first terminal 128b and the second terminal 128c of the compensation subcircuit 128 are respectively electrically connected with the second terminal 122c and the control terminal 122a of the driving subcircuit 122. The compensation subcircuit 128 is configured to perform threshold compensation on the driving subcircuit 122 in response to the second scanning signal Ga2.

For instance, the pixel circuit also includes a storage subcircuit 127, a first light-emitting control subcircuit 123, a second light-emitting control subcircuit 124, a first reset subcircuit 125, and a second reset subcircuit 129.

For instance, the first scanning signal Ga1 may be the same as the second scanning signal Ga2. For instance, the first scanning signal Ga1 and the second scanning signal Ga2 may be connected to the same signal output terminal.

For instance, the first scanning signal Ga1 and the second scanning signal Ga2 may be transmitted through the same scanning line.

In some other examples, the first scanning signal Ga1 may also be different from the second scanning signal Ga2. For instance, the first scanning signal Ga1 and the second scanning signal Ga2 may be connected to different signal output terminals. For instance, the first scanning signal Ga1 and the second scanning signal Ga2 may be respectively transmitted through different scanning lines.

The storage subcircuit 127 includes a first terminal (also referred to as a first storage electrode) 127a and a second terminal (also referred to as a second storage electrode) 127b. The first terminal 127a of the storage subcircuit is configured to receive first supply voltage VDD. The second terminal 127b of the storage subcircuit is electrically connected with the control terminal 122a of the driving subcircuit. For instance, in the data write and compensation stage, the compensation subcircuit 128 may be switched on in response to the second scanning signal Ga2, so as to store the data signal written by the data write subcircuit 126 into the storage subcircuit 127. Meanwhile, the compensation subcircuit 128 can electrically connect the control terminal 122a and the second terminal 122c of the driving subcircuit 122, so that relevant information about the threshold voltage of the driving subcircuit 122 can be correspondingly stored into the storage subcircuit. In this way, the driving subcircuit 122 can be controlled by utilization of the stored data signals and the threshold voltages in, for instance, the light-emitting stage, so that the output of the driving subcircuit 122 can be compensated.

For instance, the storage subcircuit 127 is electrically connected with the control terminal 122a of the driving subcircuit 122 and a first voltage terminal VDD and is configured to store the data signals written by the data write subcircuit 126. For instance, in the data write and compensation stage, the compensation subcircuit 128 can be switched on in response to the second scanning signal Ga2, so as to store the data signals written by the data write subcircuit 126 into the storage subcircuit 127. For instance, meanwhile, in the data write and compensation stage, the compensation subcircuit 128 can electrically connect the control terminal 122a and the second terminal 122c of the driving subcircuit 122, so that relevant information about the threshold voltage of the driving subcircuit 122 can be also correspondingly stored in the storage subcircuit. In this way, the driving subcircuit 122 can be controlled by utilization of the stored data signals and the threshold voltages in, for instance, the light-emitting stage, so that the output of the driving subcircuit 122 can be compensated.

For instance, the first light-emitting control subcircuit 123 is connected with the first terminal 122b (the second node N2) of the driving subcircuit 122 and a first voltage terminal VDD and configured to apply a first supply voltage of the first voltage terminal VDD to the first terminal 122b of the driving subcircuit 122 in response to a first light-emitting control signal EM1. For instance, as shown in FIG. 1B, the first light-emitting control subcircuit 123 is connected with a first light-emitting control terminal EM1, the first voltage terminal VDD, and the second node N2.

For instance, the second light-emitting control subcircuit 124 is connected with a second light-emitting control terminal EM2, a first terminal 134 of the light-emitting element 120, and the second terminal 122c of the driving subcircuit 122, and the second light-emitting control subcircuit is configured to apply the driving current to the light-emitting element 122 in response to a second light-emitting control signal.

For instance, in the light-emitting stage, the second light-emitting control subcircuit 124 is switched on in response to a second light-emitting control signal EM2 provided by the second light-emitting control terminal EM2, so that the driving subcircuit 122 can be electrically connected with the light-emitting element 120 through the second light-emitting control subcircuit 123, and the light-emitting element 120 can be driven to emit light under the control of the driving current; and in the non-light-emitting stage, the second light-emitting control subcircuit 123 is switched off in response to the second light-emitting control signal EM2, so as to avoid the current from flowing across the light-emitting element 120 to drive the light-emitting element to emit light, and then the contrast of corresponding display device can be improved.

Moreover, for instance, in the initialization stage, the second light-emitting control subcircuit 124 may also be switched on in response to the second light-emitting control signal, and then reset operation can be performed on the driving subcircuit 122 and the light-emitting element 120 in combination with the reset circuit.

For instance, the second light-emitting control signal EM2 may be the same as the first light-emitting control signal EM1. For instance, the second light-emitting control signal EM2 and the first light-emitting control signal EM1 may be connected to the same signal output terminal. For instance, the second light-emitting control signal EM2 and the first light-emitting control signal EM1 may be transmitted through the same light-emitting control line.

In some other examples, the second light-emitting control signal EM2 may be different from the first light-emitting control signal EM1. For instance, the second light-emitting control signal EM2 and the first light-emitting control signal EM1 may be respectively connected to different signal output terminals. For instance, the second light-emitting control signal EM2 and the first light-emitting control signal EM1 may be respectively transmitted through different light-emitting control lines.

For instance, the first reset subcircuit 125 is connected with a first reset voltage terminal Vinit1 and the control terminal 122a (the first node N1) of the driving subcircuit 122 and configured to apply the first reset voltage Vinit1 to the control terminal 122a of the driving subcircuit 122 in response to a first reset control signal Rst1.

For instance, the second reset subcircuit 129 is connected with a second reset voltage terminal Vinit2 and the first terminal 122b (a fourth node N4) of the light-emitting element 122 and configured to apply the second reset voltage Vinit2 to the first terminal 134 of the light-emitting element 120 in response to a second reset control signal Rst2. For instance, the first reset voltage Vinit1 and the second rest voltage Vinit2 may be the same voltage signal or different voltage signals. For instance, the first reset voltage terminal Vinit1 and the second reset voltage terminal Vinit2 are connected to the same reset voltage source terminal (e.g., disposed in the non-display region) to receive the same reset voltage.

For instance, the first reset subcircuit 125 and the second reset subcircuit 129 may be switched on in response to the first reset control signal Rst1 and the second reset control signal Rst2, respectively, so as to apply the second reset voltage Vinit2 to the first node N1 and apply the first reset voltage Vinit1 to the first terminal 134 of the light-emitting element 120. In this way, a reset operation can be performed on the driving subcircuit 122, the compensation subcircuit 128, and the light-emitting element 120 to eliminate the effect of the previous light-emitting stage.

For instance, the second reset control signal Rst2 of each row of subpixels and the first scanning signal Ga1 of the current row of subpixels may be a same signal and may be transmitted through a same gate line 11. For instance, the first reset control signal Rst1 of each row of subpixels may be the same as the first scanning signal Ga1 of the previous row of subpixels, and both signals may be transmitted through the same gate line 11.

For instance, the light-emitting element 120 includes the first terminal 134 (also referred to as a first electrode or a first driving electrode) and a second terminal (also referred to as a second electrode or a second driving electrode) 135. The first terminal 134 of the light-emitting element 120 is configured to be connected with the second terminal 122c of the driving subcircuit 122. The second terminal 135 of the light-emitting element 120 is configured to be connected with a second voltage terminal VSS. For instance, in an example, as shown in FIG. 1B, the first terminal 134 of the light-emitting element 120 may be connected to the fourth node N4 through the second light-emitting control subcircuit 124. The embodiment of the present disclosure includes but not limited thereto.

It is to be noted that, in the description of the embodiment of the present disclosure, the first node N1, the second node N2, the third node N3, and the fourth node N4 are not necessarily actual components but converging points that represent the connection of relevant circuits in the circuit diagram.

It is to be noted that, in the description of the embodiment of the present disclosure, the symbol Vd can represent a data signal terminal and can represent the level of a data signal. Similarly, the symbols Ga1 and Ga2 can represent a first scanning signal and a second scanning signal, and can represent a first scanning signal terminal and a second scanning signal terminal; the symbol Rst can represent a reset control terminal and can represent a reset control signal; the symbols Vinit1 and Vinit2 can represent a first reset voltage terminal and a second reset voltage terminal and can represent a first reset voltage and a second reset voltage; the symbol VDD can represent a first voltage terminal and can represent a first supply voltage; and the symbol VSS can represent a second voltage terminal and can represent a second supply voltage. The following embodiments are the same as the above. No further description will be given here.

Figure 2A:
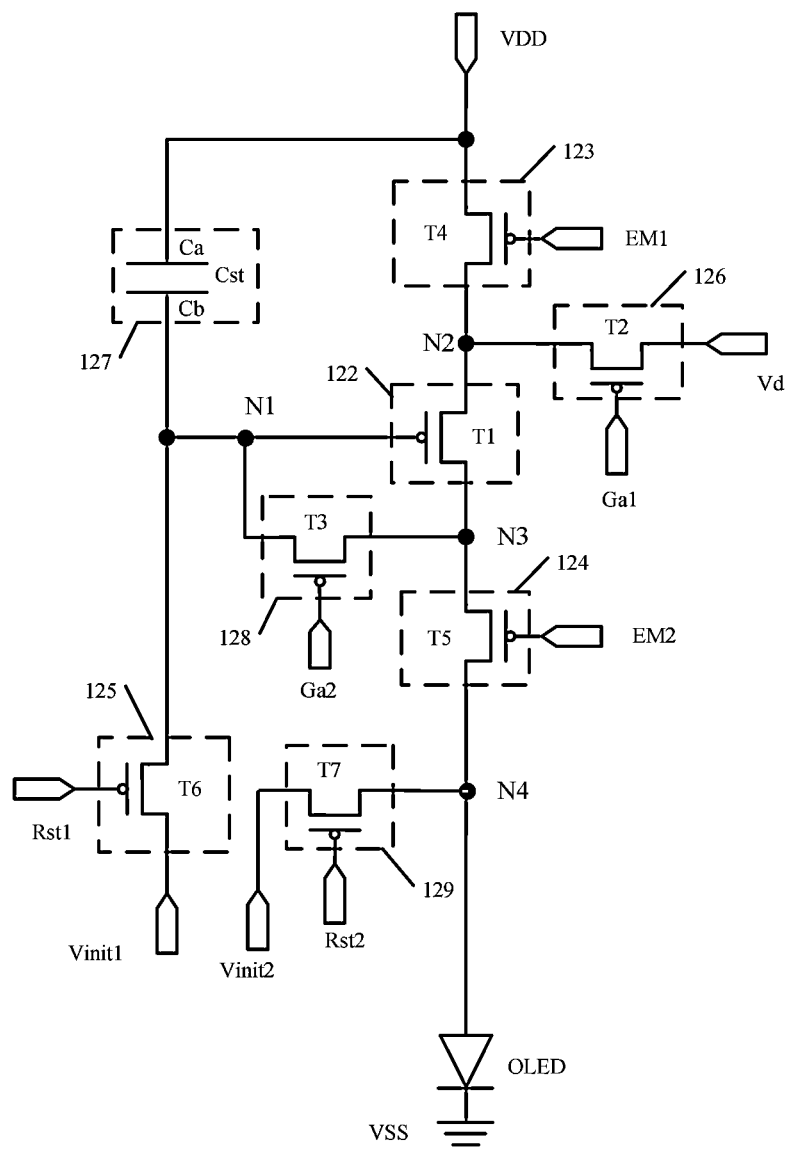
FIG. 2A is a second pixel circuit diagram of the display substrate provided by at least one embodiment of the present disclosure.

FIG. 2A is a circuit diagram of one specific implementation example of the pixel circuit as shown in FIG. 1B. As shown in FIG. 2A, the pixel circuit includes first to seventh transistors T1, T2, T3, T4, T5, T6, and T7, and a storage capacitor Cst.

For instance, as shown in FIG. 2A, the driving subcircuit 122 may be implemented as a first transistor T1 (namely a driving transistor). A gate electrode of the first transistor T1 is used as the control terminal 122a of the driving subcircuit 122 and connected with the first node N1; a first electrode of the first transistor T1 is used as the first terminal 122b of the driving subcircuit 122 and connected with the second node N2; and a second electrode of the first transistor T1 is used as the second terminal 122c of the driving subcircuit 122 and connected with the third node N3.

For instance, as shown in FIG. 2A, the data write subcircuit 126 may be implemented as a second transistor T2. A gate electrode of the second transistor T2 is connected with the first scanning line (the first scanning signal terminal Ga1) to receive the first scanning signal; a first electrode of the second transistor T2 is connected with the data line (the data signal terminal Vd) to receive the data signal; and a second electrode of the second transistor T2 is connected with the first terminal 122b (the second node N2) of the driving subcircuit 122.

For instance, as shown in FIG. 2A, the compensation subcircuit 128 may be implemented as a third transistor T3 (namely a compensation transistor). A gate electrode, a first electrode, and a second electrode of the third transistor T3 are respectively used as the control terminal 128a, the first terminal 128b, and the second terminal 128c of the compensation subcircuit. The gate electrode of the third transistor T3 is configured to be connected with the second scanning line (the second scanning signal terminal Ga2) to receive the second scanning signal; the first electrode of the third transistor T3 is connected with the second terminal 122c (the third node N3) of the driving subcircuit 122; and the second electrode of the third transistor T3 is connected with the control terminal 122a (the first node N1) of the driving subcircuit 122.

For instance, as shown in FIG. 2A, the storage subcircuit 127 may be implemented as a storage capacitor Cst. The storage capacitor Cst includes a first capacitor electrode Ca and a second capacitor electrode Cb. The first capacitor electrode Ca is connected with the first voltage terminal VDD. The second capacitor electrode Cb is connected with the control terminal 122a of the driving subcircuit 122.

For instance, as shown in FIG. 2A, the first light-emitting control subcircuit 123 may be implemented as a fourth transistor T4. A gate electrode of the fourth transistor T4 is connected with the first light-emitting control line (the first light-emitting control terminal EM1) to receive the first light-emitting control signal; a first electrode of the fourth transistor T4 is connected with the first voltage terminal VDD to receive the first supply voltage; and a second electrode of the fourth transistor T4 is connected with the first terminal 122b (the second node N2) of the driving subcircuit 122.

For instance, the light-emitting element 120 is specifically implemented as a light-emitting diode (LED), for instance, it may be an organic light-emitting diode (OLED), a quantum dot light-emitting diode (QLED), or an inorganic light-emitting diode. For example, it may be a micro light-emitting diode (Micro LED) or a micro organic light-emitting diode (Micro OLED). For instance, the light-emitting element 120 may be a top-emission structure, a bottom-emission structure, or a double-sided emission structure. The light-emitting element 120 may emit red light, green light, blue light, white light, etc. The specific structure of the light-emitting element is not limited by the embodiment of the present disclosure.

For instance, a first electrode 134 (also referred to as a pixel electrode, e.g., an anode) of the light-emitting element 120 is connected with the fourth node N4 and configured to be connected to the second terminal 122c of the driving subcircuit 122 through the second light-emitting control subcircuit 124, and a second electrode 135 (e.g., a cathode) of the light-emitting element 120 is configured to be connected with the second voltage terminal VSS to receive the second supply voltage VSS. The brightness of the light-emitting element is determined by the current flowing into the light-emitting element 120 from the second terminal 122c of the driving subcircuit 122. For instance, the second voltage terminal may be grounded, namely VSS may be 0V. For instance, the second supply voltage VSS may be a negative voltage.

For instance, the second light-emitting control subcircuit 124 may be implemented as a fifth transistor T5. A gate electrode of the fifth transistor T5 is connected with the second light-emitting control line (the second light-emitting control terminal EM2) to receive the second light-emitting control signal; a first electrode of the fifth transistor T5 is connected with the second terminal 122c (the third node N3) of the driving subcircuit 122; and a second electrode of the fifth transistor T5 is connected with the first terminal 134 (the fourth node N4) of the light-emitting element 120.

For instance, the first reset subcircuit 125 may be implemented as a sixth transistor T6, and the second reset subcircuit is implemented as a seventh transistor T7. A gate electrode of the sixth transistor T6 is configured to be connected with a first reset control terminal Rst1 to receive the first reset control signal Rst1; a first electrode of the sixth transistor T6 is connected with the first reset voltage terminal Vinit1 to receive the first reset voltage Vinit1; and a second electrode of the sixth transistor T6 is configured to be connected with the first node N1. A gate electrode of the seventh transistor T7 is configured to be connected with a second reset control terminal Rst2 to receive the second reset control signal Rst2; a first electrode of the seventh transistor T7 is connected with the second reset voltage terminal Vinit2 to receive the second reset voltage Vinit2; and a second electrode of the seventh transistor T7 is configured to be connected with the fourth node N4.

It is to be noted that all the transistors adopted in the embodiments of the present disclosure may be thin-film transistors (TFTs), field-effect transistors (FETs) or other switching elements with same properties, and the description is given in the embodiments of the present disclosure by using the TFT as examples. Source electrodes and drain electrodes of the transistors adopted here may be symmetrical in structure, so the source electrode and the drain electrode of the transistor may have no difference in structure. In the embodiment of the present disclosure, in order to distinguish the two electrodes of the transistor other than the gate electrode, one electrode is directly described as a first electrode and the other electrode is a second electrode.

In addition, the transistors may be divided into N-type transistors and P-type transistors according to the characteristics of the transistors. When the transistor is a P-type transistor, the "on" voltage is a low-level voltage (e.g., 0V, −5V, −10V, or other appropriate voltage), and the "off" voltage is a high-level voltage (e.g., 5V, 10V, or other appropriate voltage). When the transistor is an N-type transistor, the "on" voltage is high-level voltage (e.g., 5V, 10V, or other appropriate voltage), and the "off" voltage is a low-level voltage (e.g., 0V, −5V, −10V, or other appropriate voltage). For instance, as shown in FIG. 1B, the first to seventh transistors T1-T7 are all P-type transistors, e.g., low-temperature polysilicon thin-film transistors (LTPS TFTs). However, the embodiment of the present disclosure does not limit the type of the transistor. When the type of the transistor is changed, the connecting relationships in the circuit are correspondingly adjusted.

Figure 2B:
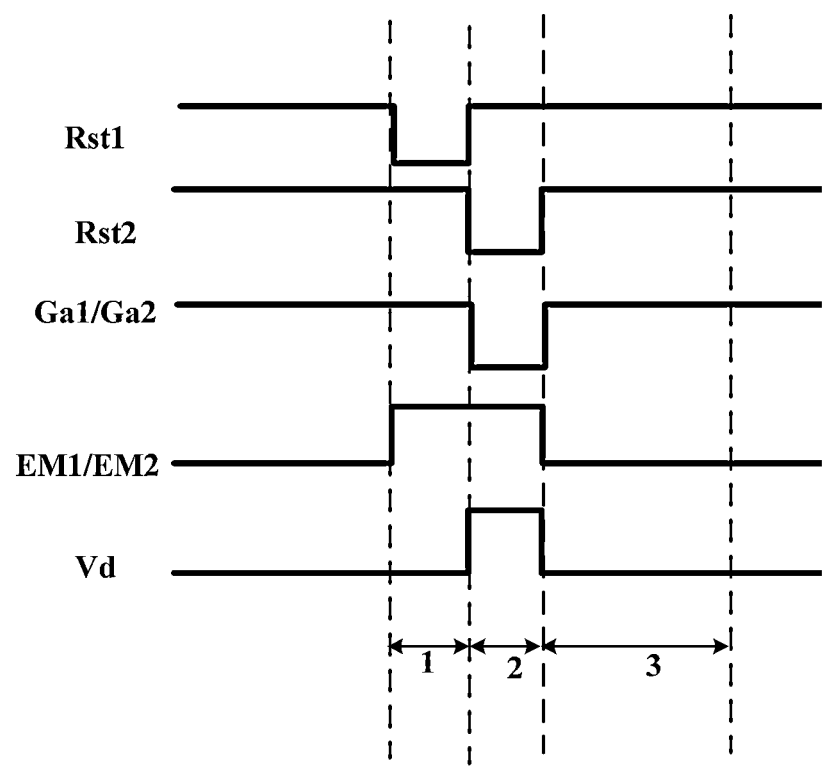
FIG. 2B is a timing signal diagram of the pixel circuit provided by at least one embodiment of the present disclosure.

Description will be given below to the working principle of the pixel circuit as shown in FIG. 2A in combination with the signal timing diagram as shown in FIG. 2B. As shown in FIG. 2B, the display process of each frame of image includes three stages, which are respectively an initialization stage 1, a data write, and compensation stage 2, and a light-emitting stage 3.

As shown in FIG. 2B, in the embodiment, the first scanning signal Ga1 and the second scanning signal Ga2 adopt the same signal, and the first light-emitting control signal EM1 and the second light-emitting control signal EM2 adopt the same signal; the second reset control signal Rst2 and the first scanning signal Ga1/the second scanning signal Ga2 have same waveform, namely the second reset control signal Rst2 and the first scanning signal Ga1/the second scanning signal Ga2 may adopt the same signal; and the first reset signals Rst1 of the current row of subpixels have same waveform with the first scanning signals Ga1/the second scanning signals Ga2 of the previous row of subpixels, namely adopting the same signals. However, this will not be construed as the limitation of the present disclosure. In other embodiments, different signals may be respectively used as the first scanning signal Ga1, the second scanning signal Ga2, the first reset control signal Rst1, and the second reset control signal Rst2, and different signals are respectively used as the first light-emitting control signal EM1 and the second light-emitting control signal EM2.

In the initialization stage 1, the first reset control signal Rst1 is inputted to switch on the sixth transistor T6, and the first reset voltage Vinit1 is applied to the gate electrode of the first transistor T1 to reset the first node N1.

In the data write and compensation stage 2, the first scanning signal Ga1, the second scanning signal Ga2 and the data signal Vd are inputted to switch on the second transistor T2 and the third transistor T3, and the data signal Vd is written into the second node N2 by the second transistor T2 and charges the first node N1 through the first transistor T1 and the third transistor T3, until the electric potential of the first node N1 is changed to Vd+Vth, the first transistor T1 is switched off, where Vth is the threshold voltage of the first transistor T1. The electric potential of the first node N1 is stored in the storage capacitor Cst to be maintained, that is, voltage information with the data signal and the threshold voltage Vth is stored in the storage capacitor Cst, so as to provide grayscale display data and compensate the own threshold voltage of the first transistor T1 in the subsequent light-emitting stage.

In the data write and compensation stage 2, the second reset control signal Rst2 may also be inputted to switch on the seventh transistor T7, and the second reset voltage Vinit2 is applied to the fourth node N4 to reset the fourth node N4. For instance, the reset on the fourth node N4 may also be executed in the initialization stage 1. For instance, the first reset control signal Rst1 and the second reset control signal Rst2 may be the same. No limitation will be given here in the embodiment of the present disclosure.

In the light-emitting stage 3, the first light-emitting control signal EM1 and the second light-emitting control signal EM2 are inputted to switch on the fourth transistor T4, the fifth transistor T5, and the first transistor T1, and the fifth transistor T5 applies the driving current to an OLED to drive the OLED to emit light. The value of the driving current I flowing across the OLED may be obtained according to the following formula:

$$I=K(VGS-Vth)^2=K[(Vdata+Vth-VDD)-Vth]^2=K(Vdata-VDD)^2,$$

where K is the conductivity of the first transistor.

In the above formula, Vth represents the threshold voltage of the first transistor T1; VGS represents the voltage between the gate electrode and the source electrode (the first electrode here) of the first transistor T1; and K is a constant value relevant to the first transistor T1. As can be seen from the above formula I, the driving current I flowing across the OLED is not relevant to the threshold voltage Vth of the first transistor T1 any more, so as to realize the compensation on the pixel circuit, thereby solving the problem of threshold voltage drift caused by the manufacturing process and the long-term operation of the driving transistor (the first transistor T1 in the embodiment of the present disclosure), eliminating the impact of the driving transistor on the driving current I, and improving the display effect of the display device employing the driving transistor.

Exemplary description will be given below to the structure of the display substrate provided by at least one embodiment of the present disclosure by using the pixel circuit as shown in FIG. 2A as an example in combination with FIGS. 3A-3B, FIG. 4, FIGS. 5A-5D, FIGS. 6A-6B, and FIGS. 7A-7B. However, the invention concept of the present disclosure is not limited to this specific pixel structure.

Figure 3A:
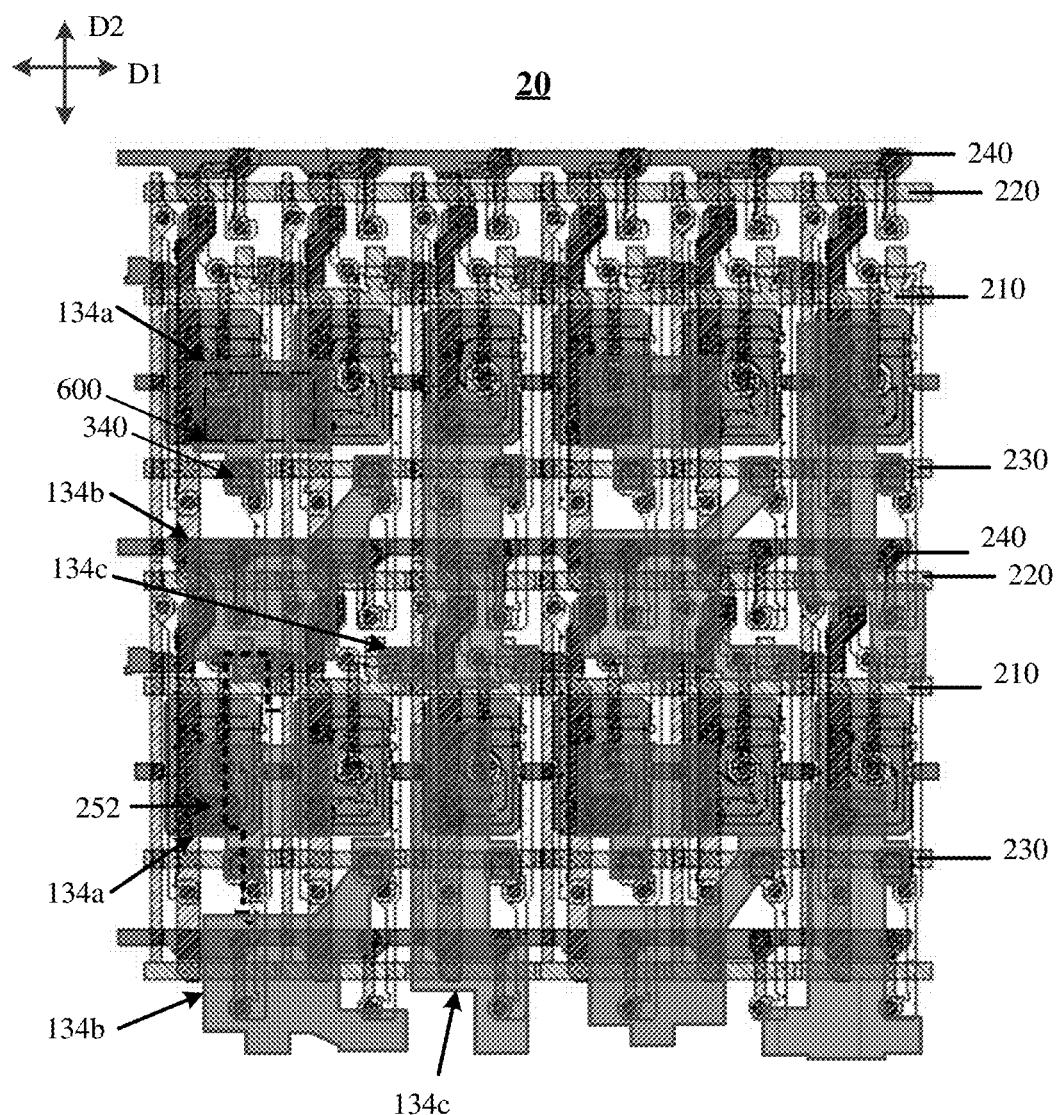
FIG. 3A is a second schematic diagram of the display substrate provided by at least one embodiment of the present disclosure.
Figure 3B:
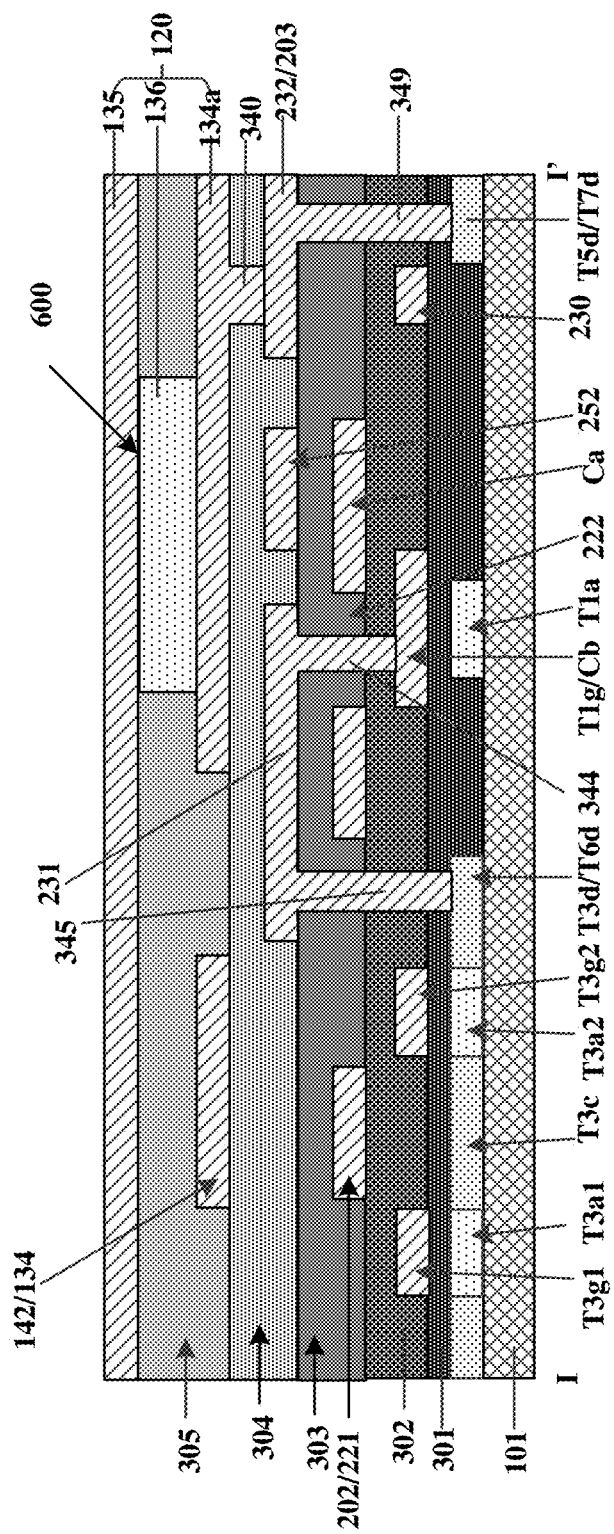
FIG. 3B is a sectional view of FIG. 3A along a section line I-I'.

FIG. 3A is a schematic diagram of the display substrate 20 provided by at least one embodiment of the present disclosure. FIG. 3B is a sectional view of FIG. 3A along the section line I-I'. It is to be noted that for clarity, FIG. 3B omits some structures without direct electrical connection on the section line.

As shown in FIG. 3A, the display substrate 20 comprises a base substrate 101, and a plurality of subpixels 100 are disposed on the base substrate 101. Pixel circuits of the plurality of subpixels 100 are arranged in a pixel circuit array. For instance, the row direction of the pixel circuit array is a first direction D1, and the column direction is a second direction D2. In some embodiments, the pixel circuits of the subpixels may have completely same structure, namely the pixel circuits are repeatedly arranged in the row and column directions.

For the convenience of description, FIG. 3A illustratively shows two rows and six columns of subpixels. For instance, as shown in FIG. 3A, the arrangement rule of the pixel circuits of the subpixels is different from the arrangement rule of pixel electrodes (134a, 134b, and 134c) above the pixel circuits. For the convenience of description, the description of the arrangement of the subpixels refers to the arrangement rule of the pixel circuits. For instance, adjacent subpixels represent subpixels with adjacent pixel circuits. For instance, the plurality of subpixels include first subpixels, second subpixels, and third subpixels. The first subpixels, the second subpixels, and the third subpixels are configured to emit light of different colors, for instance, respectively configured to emit red light, green light, and blue light. For instance, the first subpixels, the second subpixels, and the third subpixels are adjacent to each other in the first direction. FIG. 3A shows the pixel electrode 134a of the first subpixel, the pixel electrode 134b of the second subpixel, and the pixel electrode 134c of the third subpixel.

As can be seen from FIGS. 3A-3B, a semiconductor layer 102, a first insulating layer 301, a first conductive layer 201, a second insulating layer 302, a second conductive layer 202, a third insulating layer 303, a third conductive layer 203, a fourth insulating layer 304, and a fourth conductive layer 204 are sequentially disposed on the base substrate 101 to form the structure of the display substrate as shown in FIG. 3A.

Figure 4:
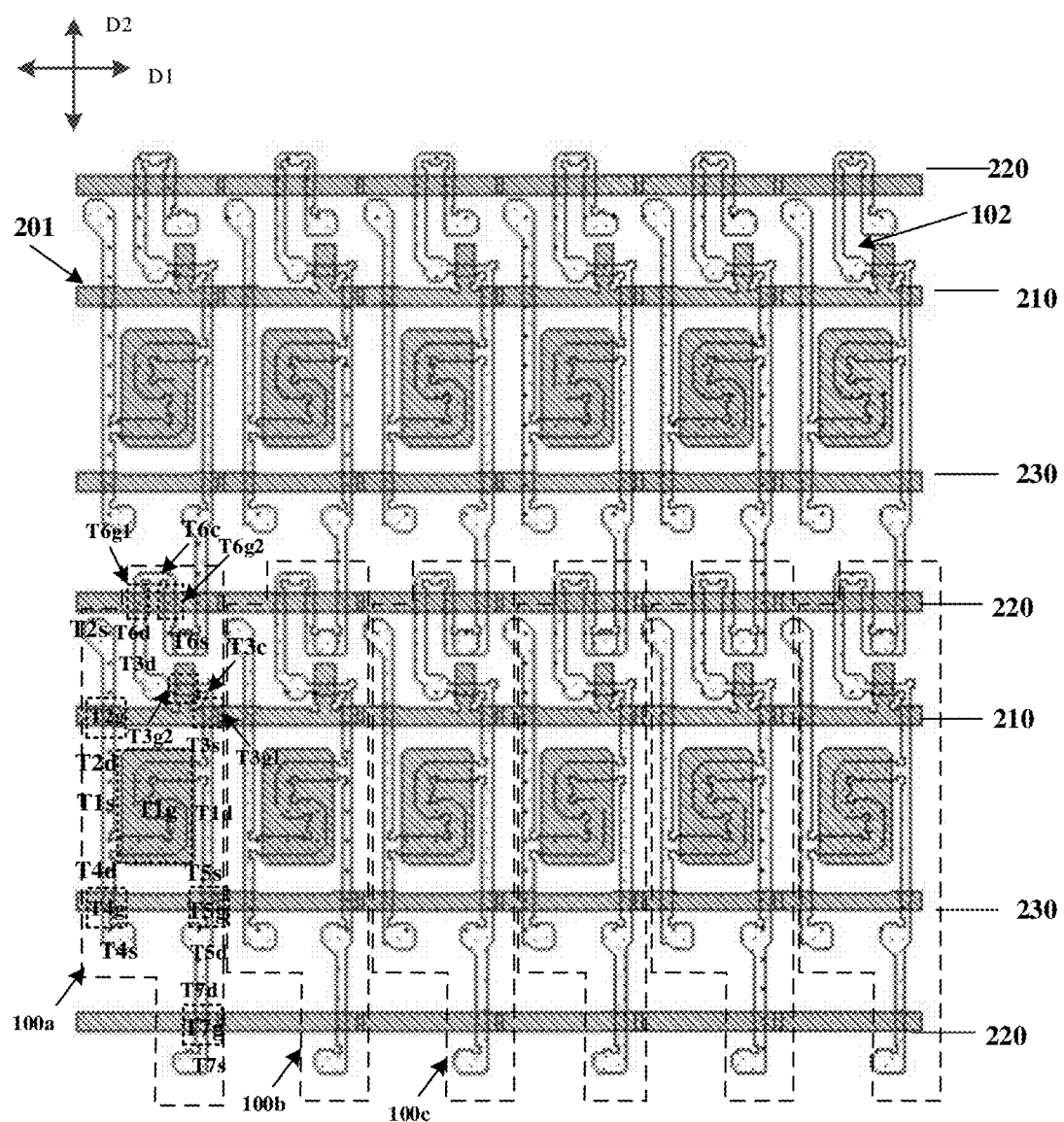
FIG. 4 is a third schematic diagram of the display substrate provided by at least one embodiment of the present disclosure.
Figure 5A:
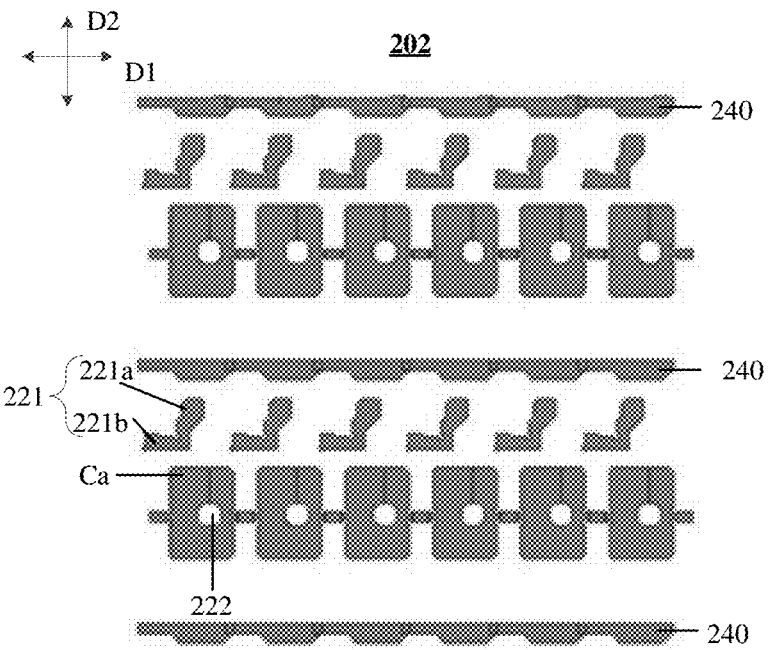
FIG. 5A is a fourth schematic diagram of the display substrate provided by at least one embodiment of the present disclosure.
Figure 5B:
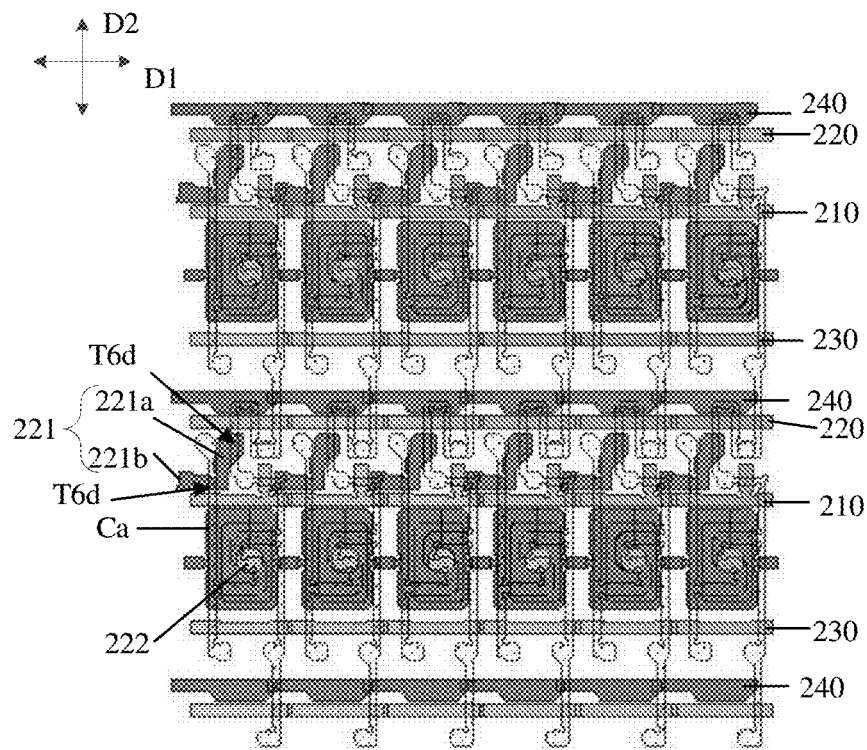
FIG. 5B is a fifth schematic diagram of the display substrate provided by at least one embodiment of the present disclosure.
Figure 6A:
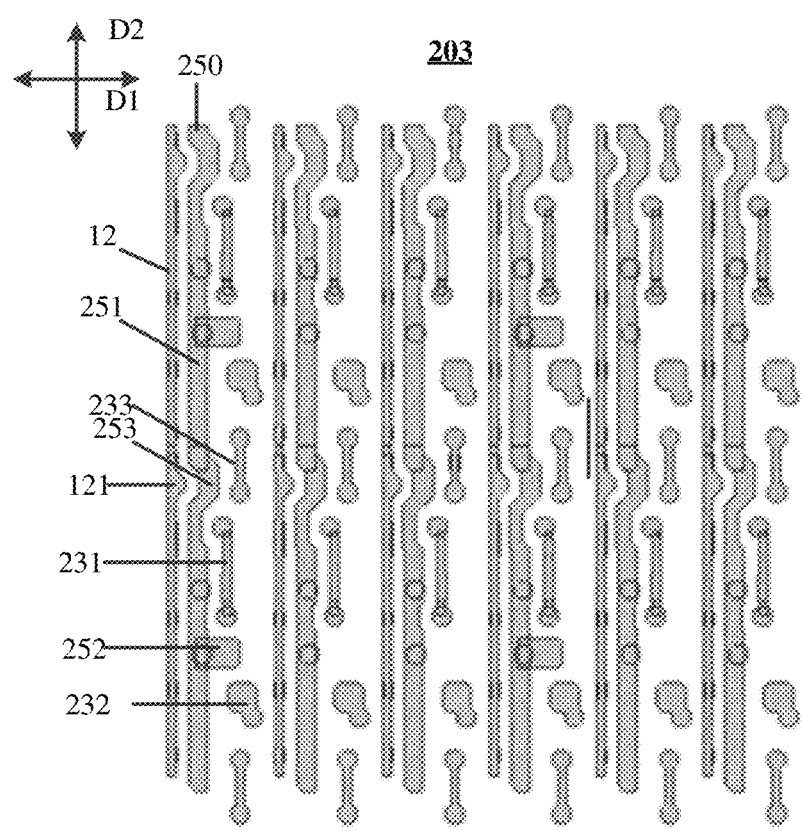
FIG. 6A is a sixth schematic diagram of the display substrate provided by at least one embodiment of the present disclosure.
Figure 6B:
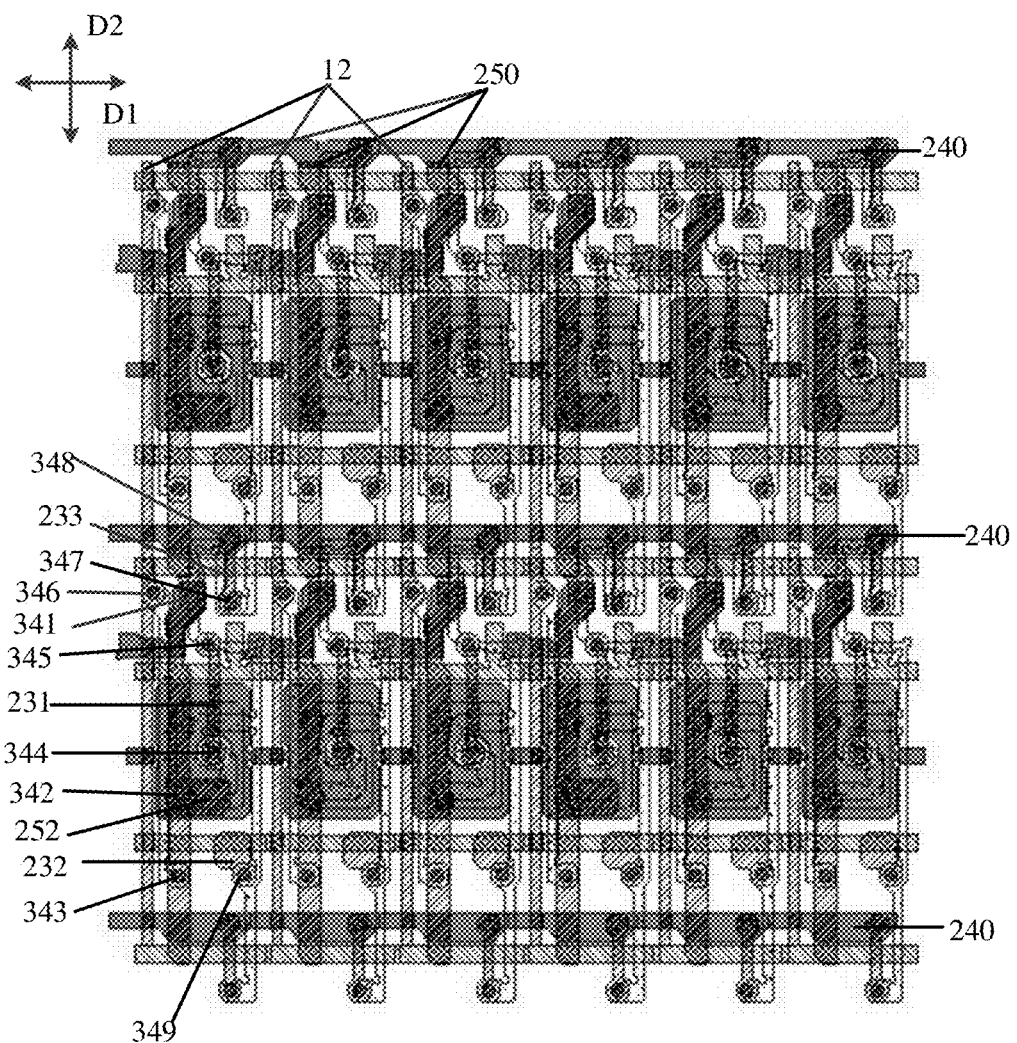
FIG. 6B is a seventh schematic diagram of the display substrate provided by at least one embodiment of the present disclosure.

FIG. 4 shows semiconductor layers 102 and first conductive layers (gate layers) 201 of transistors T1-T7 in 12 subpixels 100, corresponding to FIG. 3A; FIG. 5A shows the second conductive layer 202; FIG. 5B shows the second conductive layer 202 on the basis of FIG. 4; FIG. 6A shows the third conductive layer 203; FIG. 6B shows the third conductive layer 203 on the basis of FIG. 5B; and FIG. 7 shows the semiconductor layer 102, the first conductive layer 201, and the fourth conductive layer 204.

For the convenience of description, Tng, Tns, Tnd, and Tna are used in the following description to respectively represent a gate electrode, a first electrode, a second electrode, and a channel region of the nth transistor Tn, where n is one to seven.

It is to be noted that "same-layer arrangement" referred to in the present disclosure represents that two (or more than two) structures are formed by a same deposition process and formed by being patterned by a same pattering process, with same or different materials; and "integrated structure" represents that two (or more than two) structures are formed by a same deposition process and formed by being patterned by a same patterning process, with same or different materials.

For instance, as shown in FIG. 4, the first conductive layer 201 includes a gate electrode of each transistor and some scanning lines and control lines. FIG. 4 illustratively shows a region provided with the pixel circuit of each subpixel 100 with a large dashed block, and shows gate electrodes T1g-T7g of first to seventh transistors T1-T7 in one subpixel 100 with small dashed blocks.

The semiconductor layer 102 includes active layers T1a-T7a of the first to seventh transistors T1-T7. As shown in FIG. 3A, the active layers T1a-T7a of the first to seventh transistors T1-T7 are connected with each other to form an integrated structure. For instance, the semiconductor layers 20 in each column of subpixels are mutually connected integrated structure, and the semiconductor layers in two adjacent columns of subpixels are spaced apart from each other.

For instance, as shown in FIG. 4, the first conductive layer 201 includes gate electrodes T1g-T7g of the first to seventh transistors T1-T7. For instance, the display substrate 20 adopts self-alignment process and utilizes the first conductive layer 201 as a mask to perform conduction processing (e.g., doping process) on the semiconductor layer 102, so that parts of the semiconductor layer 102 not covered by the first conductive layer 201 can be conducted, and then parts of the active layers of the transistors located on two sides of each channel region are conducted to form the first electrodes and the second electrodes of the transistors, respectively.

For instance, as shown in FIG. 4, the third transistor T3 and the sixth transistor T6 respectively adopt dual-gate structure, so as to improve the gate-control capability of the transistors and reduce the leakage current. As both the third transistor T3 and the sixth transistor T6 are transistors directly connected with the gate electrode of the first transistor T1 (namely the driving transistor), the stability of the third transistor T3 and the sixth transistor T6 directly affects the stability of the voltage of the gate electrode (the N1 node) of the first transistor T1. The adoption of the dual-gate structure improves the gate-control capability of the third transistor T3 and the sixth transistor T6, which also can reduce the leakage current of the transistors and maintain the voltage of the N1 node, and fully compensate the threshold voltage of the first transistor T1 in the compensation stage, then improve the display uniformity of the display substrate in the light-emitting stage.

As shown in FIG. 4, the third transistor T3 includes a first gate electrode T3g1 and a second gate electrode T3g2 and a first channel region and a second channel region respectively corresponding to the first gate electrode T3g1 and the second gate electrode T3g2, and the first channel region and the second channel region are respectively shielded by the first gate electrode T3g1 and the second gate electrode T3g2 and not shown in the figure. For instance, the first gate electrode T3g1 is disposed on a main body of a scanning line 220 that controls the third transistor T3, and the second gate electrode T3g2 is a protrusion protruded from the main body of the scanning line 220 along the second direction D2. The third transistor T3 also includes a conduction region T3c disposed between the first gate electrode T3g1 and the second gate electrode T3g2. The conduction region T3c is formed by the conduction of an exposed semiconductor layer between the first gate electrode T3g1 and the second gate electrode T3g2. The conduction region T3c and a second electrode T3s of the third transistor T3 are spaced by the first channel region of the third transistor T3. The conduction region T3c and a second electrode T3d of the third transistor T3 are spaced by the second channel region of the third transistor T3. The conduction region T3c and the channel region of the third transistor T3 are an integrated structure, for instance, they both include polysilicon materials. Similarly, the sixth transistor T6 also includes a conduction region T6c disposed between the first gate electrode T6g1 and the second gate electrode T6g2.

For instance, the first conductive layer 201 also includes a plurality of scanning lines 210, a plurality of reset control lines 220 and a plurality of light-emitting control lines 230 which are insulated from each other. For instance, each row of subpixels are respectively and correspondingly connected with one scanning line 210, two reset control lines 220, and one light-emitting control line 230.

The scanning line 210 is electrically connected with (or be an integrated structure with) gate electrodes of second transistors T2 in one corresponding row of subpixels to provide the first scanning signal Ga1. The reset control line 220 is electrically connected with gate electrodes of sixth transistors T6 in one corresponding row of subpixels to provide the first reset control signal Rst1. The light-emitting control line 230 is electrically connected with gate electrodes of fourth transistors T4 in one corresponding row of subpixels to provide the first light-emitting control signal EM1.

For instance, as shown in FIG. 4, the scanning line 210 is also electrically connected with the gate electrode of the third transistor T3 to provide the second scanning signal Ga2, that is, the first scanning signal Ga1 and the second scanning signal Ga2 may be the same signal; and the light-emitting control line 230 is also electrically connected with the gate electrode of the fifth transistor T5 to provide the second light-emitting control signal EM2, that is, the first light-emitting control signal EM1 and the second light-emitting control signal EM2 are the same signal.

For instance, the first gate electrode T3g1 extends along the first direction D1 and is a part of the scanning line 210. The second gate electrode T3g2 extends along the second direction D2 and is an extension of the scanning line 210 extending along the second direction D2.

For instance, as shown in FIG. 4, gate electrodes of seventh transistors T7 of the current row of pixel circuits are electrically connected with the reset control line 220 corresponding to the next row of pixel circuits (that is, a pixel circuit row provided with scanning lines that are sequentially switched on after the current row of scanning lines according to the scanning sequence of the scanning lines) to receive the second reset control signal Rst2.

For instance, as shown in FIGS. 5A-5B, the second conductive layer 202 includes first capacitor electrodes Ca. The first capacitor electrode Ca is overlapped with the gate electrode T1g of the first transistor T1 in a direction perpendicular to the base substrate 101 to form a storage capacitor Cst, that is, the gate electrode T1g of the first transistor T1 is used as a second capacitor electrode Cb of the storage capacitor Cst. For instance, the first capacitor electrode Ca includes an opening 222 which exposes at least part of the gate electrode T1g of the first transistor T1 so as to provide convenience for the electrical connection between the gate electrode T1g and other structures. For instance, the first capacitor electrodes Ca of the subpixels in the same pixel row are connected with each other to form an integrated structure.

For instance, the second conductive layer 202 may also include a plurality of reset voltage lines 240 which extend along the first direction D1. The plurality of reset voltage lines 240 are connected with a plurality of rows of subpixels in one-to-one correspondence. The reset voltage line 240 is electrically connected with first electrodes of sixth transistors T6 in one corresponding row of subpixels to provide the first reset voltage Vinit1.

For instance, as shown in FIG. 5B, first electrodes of seventh transistors T7 in the current row of subpixels are electrically connected with the reset voltage line 240 corresponding to the next row of subpixels to receive the second reset voltage Vinit2. Detailed description will be given below with reference to FIG. 6B.

For instance, as shown in FIGS. 5A-5B, the second conductive layer 202 may also include shielding electrodes 221. For instance, each shielding electrode 221 is overlapped with a corresponding first electrode T2s of the second transistor T2 in the direction perpendicular to the base substrate 101 so as to protect the signal in the first electrode T2s of the second transistor T2 from being interfered by other signals. As the first electrode T2s of the second transistor T2 is configured to receive the data signal Vd, the data signal Vd determines the display grayscale of the subpixel. Therefore, the shielding electrodes 221 improve the stability of the data signals, and improve the display performance.

For instance, with reference to FIGS. 5A and 4, the shielding electrode 221 is also at least partially overlapped with a second electrode T6d of the sixth transistor T6 in the direction perpendicular to the base substrate 101, so as to improve the stability of the signal on the second electrode T6d, thereby improving the stability of the sixth transistor T6 and further stabilizing the gate voltage of the first transistor T1.

For instance, with reference to FIGS. 5B and 4, the shielding electrode 221 also extends to an adjacent subpixel and is at least partially overlapped with the conduction region T3c of the third transistor T3 in the adjacent subpixel in the direction perpendicular to the base substrate 101, so as to improve the stability of the signal in the conduction region T3c, thereby improving the stability of the third transistor T3 and further stabilizing the gate voltage of the first transistor T1.

For instance, a stable capacitor is formed by the shielding electrode 221, and the first electrode T2s of the second transistor T2, and the second electrode T6d of the sixth transistor T6 that are directly opposite to (overlapped with) the shielding electrode. The shielding electrode 221 is configured to load a fixed voltage. As the voltage difference at two ends of the capacitor cannot be changed suddenly, the stability of the voltage on the first electrode T2s of the second transistor T2, the conduction region T3c of the third transistor T3, and the second electrode T6d of the sixth transistor T6 is improved. For instance, the shielding electrode 221 is electrically connected with a power line 250 in the third conductive layer 203 to load the first supply voltage VDD.

For instance, as shown in FIGS. 5A-5B, each shielding electrode 221 is L-shaped or V-shaped and includes a first branch 221a and a second branch 221b with different extension directions. The first branch 221a is at least partially overlapped with the second electrode T6d of the sixth transistor T6 in the direction perpendicular to the base substrate 101. The second branch 221b is respectively at least partially overlapped with the first electrode T2s of the second transistor T2 and the conduction region T3c of the third transistor T3 in the adjacent subpixel in the direction perpendicular to the base substrate 101, so as to shield the conduction region T3c to improve the stability of the transistor. For instance, the first branch 221a extends along the second direction D2, and the second branch 221b extends along the first direction D1.

For instance, the first branch 221a of the shielding electrode 221 is a folded line structure, which provides convenience for the overlapping of an end part of the first branch 221a away from the second branch 221b and the second electrode T6d of the sixth transistor T6, and provides convenience for the overlapping of the end part of the first branch 221a and the power line 250 above the end part to realize electrical connection (as shown in FIG. 6B).

For instance, as shown in FIGS. 6A-6B, the third conductive layer 203 includes a plurality of power lines 250 extending along the second direction D2. For instance, the plurality of power lines 250 are electrically connected with the plurality of columns of subpixels in one-to-one correspondence to provide the first supply voltage VDD. The power lines 250 are electrically connected with the first capacitor electrodes Ca in a corresponding column of subpixels through via holes 342, and electrically connected with first electrodes of the fourth transistors T4 through via holes 343. For instance, the power line 250 is also electrically connected with the shielding electrode 221 through a via hole 341, so that the shielding electrode 221 can have a constant potential, and the shielding capability of the shielding electrode is improved. For instance, both the via holes 342 and the via holes 341 run through the third insulating layer 303, and the via holes 343 run through the first insulating layer 301, the second insulating layer 302, and the third insulating layer 303.

For instance, the third conductive layer 203 also includes a plurality of data lines 12 extending along the second direction D2. For instance, the plurality of data lines 12 are electrically connected with the plurality of columns of subpixels in one-to-one correspondence to provide data signals. For instance, the data lines 12 are electrically connected with first electrodes T2s of second transistors T2 in a corresponding column of subpixels through via holes 346 (one example of second via holes in the present disclosure) to provide the data signals. For instance, the via holes 346 run through the first insulating layer 301, the second insulating layer 302, and the third insulating layer 303.

For instance, with reference to FIGS. 3A-3B and FIGS. 6A-6B, the third conductive layer 203 also includes connecting electrodes 231 (one example of second connecting electrodes in the present disclosure). One end of each connecting electrode 231 is electrically connected with the gate electrode T1g of the first transistor T1, namely a second capacitor electrode Cb, through the opening 222 in the first capacitor electrode Ca and a via hole 344 in the insulating layer, and the other end is electrically connected with the second electrode T3d of the third transistor T3 through a via hole 345, so that the second capacitor electrode Cb can be electrically connected with the second electrode T3d of the third transistor T3. For instance, the via holes 344 run through the second insulating layer 302 and the third insulating layer 303. For instance, the via holes 345 run through the first insulating layer 301, the second insulating layer 302, and the third insulating layer 303.

For instance, with reference to FIGS. 3A-3B and FIGS. 6A-6B, the third conductive layer 203 also includes connecting electrodes 232 (one example of first connecting electrodes in the present disclosure). Each connecting electrode 232 is electrically connected with a second electrode T5d of the fifth transistor T5 through a via hole 349 and configured to electrically connect the second electrode T5d of the fifth transistor T5 and the pixel electrode 134 of the light-emitting element. For instance, the via holes 349 run through the first insulating layer 301, the second insulating layer 302, and the third insulating layer 303. Detailed description will be given below.

The power line 250 includes a power line main body 251 extending along the second direction D2 and a power line protrusion 252 protruded from the power line main body 251. The power line protrusion 252 is at least partially overlapped with the pixel electrode 134a of the first subpixel in the direction perpendicular to the base substrate.

As the third conductive layer 203 includes a variety of signal lines, such as data lines, in order to reduce the wiring resistance, the third conductive layer 203 has a large thickness, for instance, the thickness of the third conductive layer is thicker than the first conductive layer and the second conductive layer. Moreover, as the third conductive layer is a conductive layer that is closest to the above pixel electrode layer (namely the fourth conductive layer 204), the appearance of the third conductive layer will affect the flatness of the pixel electrode. The embodiment of the present disclosure can effectively improve the flatness of the pixel electrode, so as to improve the display quality, by the arrangement of the power line protrusion 252 on the power line 250.

Figure 6C:
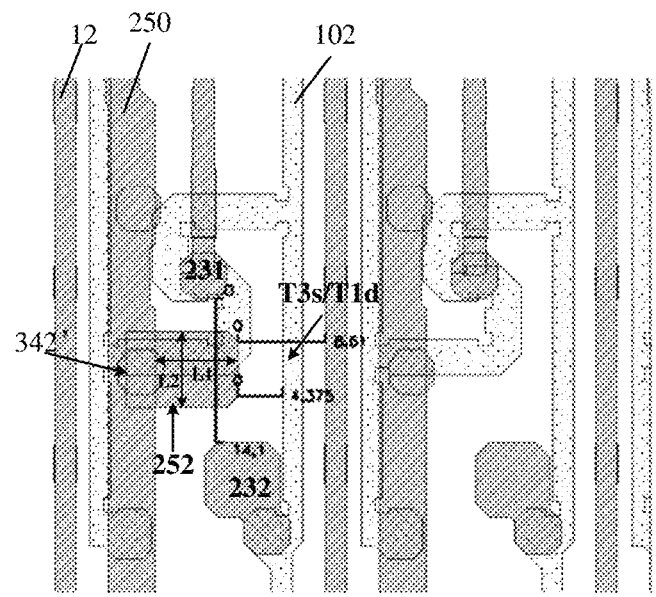
FIG. 6C is an eighth schematic diagram of the display substrate provided by at least one embodiment of the present disclosure.
Figure 6D:
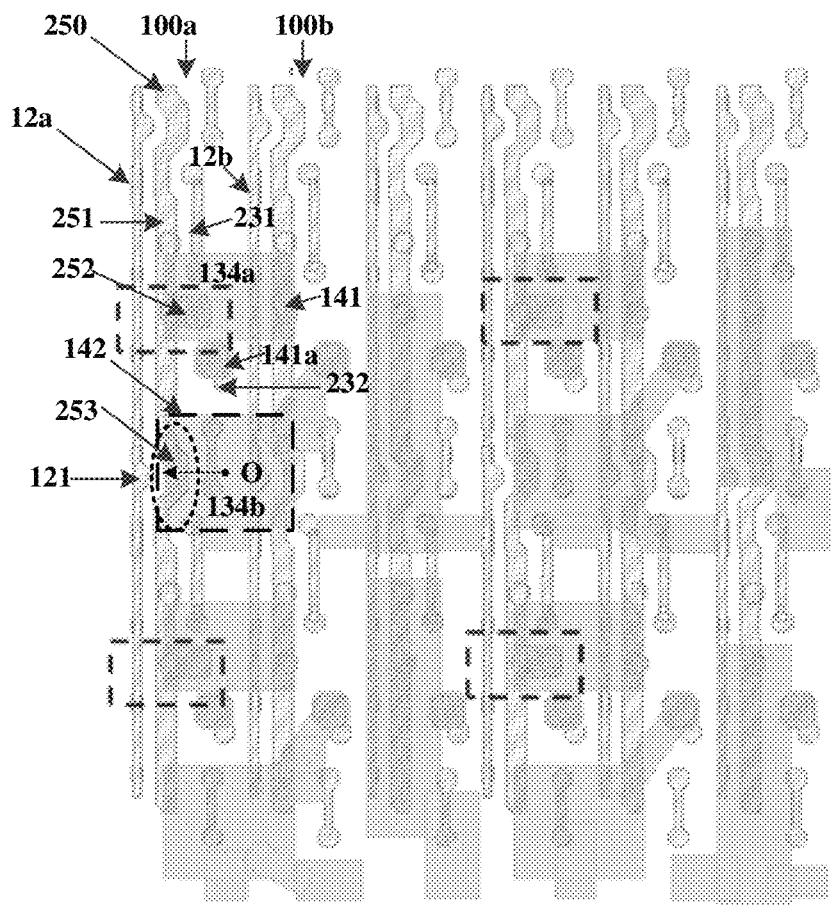
FIG. 6D is a ninth schematic diagram of the display substrate provided by at least one embodiment of the present disclosure.

FIGS. 6C and 6D are schematic diagrams that respectively show the power line protrusions 252. For clarity, FIG. 6C only shows the semiconductor layer 102 and the third conductive layer 203, and FIG. 6D only shows the third conductive layer 203 and the pixel electrode layer on the third conductive layer. FIG. 6D shows the power line protrusions 252 with rectangular dashed blocks.

FIG. 6C shows a via hole region 342' on the power line 250 corresponding to the via hole 342. The via hole region 342' covers the via hole 342. As shown in FIG. 6C, the via hole region 342' is arranged on a part of the power line main body 251 that is directly connected with the power line protrusion 252. For instance, in the second direction, the via hole region 342' is at least partially overlapped with the power line protrusion 252. As the via hole region 342' must meet a given size to ensure the effective connection through the via hole 342 and the problems, such as poor contact and disconnection, can be caused by a too small via hole region 342', the via hole region 342' is disposed on a part of the power line main body 251 that is directly connected with the power line protrusion 252, so as to increase the size of the via hole region 342', and the connecting quality can be improved. For instance, the power line protrusion 252 is partially overlapped or not overlapped with the via hole 342 in the direction perpendicular to the base substrate, so as to improve the flatness of the power line protrusion 252.

With reference to FIGS. 6A-6D, the connecting electrode 232 and the connecting electrode 231 are respectively at least partially overlapped with the pixel electrode 134a of the first subpixel in the direction perpendicular to the base substrate. In the second direction, the connecting electrode 232 and the connecting electrode 231 are respectively oppositely arranged relative to the pixel electrode 134a, and a gap is provided between the connecting electrode 232 and the connecting electrode 231. The gap is at least partially covered by the pixel electrode 134a, so that the pixel electrode 134a is prone to form a depression and is uneven, and adverse impact can be caused on the display quality. The power line protrusion 252 is protruded from the power line main body 251 along the first direction D1 and is disposed between the connecting electrode 231 and the connecting electrode 232 in the second direction D2. For instance, in the second direction D2, the power line protrusion 252 is respectively at least partially overlapped with the connecting electrode 231 and the connecting electrode 232.

By arrangement of the power line protrusion 252, the gap between the connecting electrode 232 and the connecting electrode 231 can be filled up, so as to effectively improve the flatness of the pixel electrode 134a thereon, and improve the display quality. Moreover, as a stable supply voltage is loaded on the power line protrusion, compared to other conductive structures with changed voltage or floating electrodes (virtual electrodes) with unstable voltage, the interference on other node voltage in the circuit can be reduced.

In addition, the power line protrusion 252 can also have the function of shielding the connecting electrode 232 and the connecting electrode 231. As the connecting electrode 232 is connected with the fourth node N4 to provide a data grayscale signal to the pixel electrode, the connecting electrode 231 is connected with the first node N1 to load the gate signal of the first transistor T1. The two signals are very important to the display quality. The arrangement of the power line protrusion 252 can avoid the mutual interference of signals on the connecting electrode 232 and the connecting electrode 231, so as to improve the display quality.

For instance, in the second direction D2, the proportion ratio between the maximum dimension of the power line protrusion 252 and the minimum spacing between the connecting electrode 231 and the connecting electrode 232 is 0.4-0.8. For instance, if the proportion is too small, the dimension of the power line protrusion in the second direction D2 is too small, and the filling effect is limited; if the proportion is too large, the distance between the power line protrusion and the connecting electrodes 231 and 232 is reduced, which may result in a short circuit, because the design rule cannot be satisfied.

For instance, as shown in FIG. 6C, the maximum dimension L2 of the power line protrusion 252 in the second direction D2 is 7.35 μm, and the minimum spacing between the connecting electrode 231 and the connecting electrode 232 in the second direction D2 is 14.1 μm.

For instance, as shown in FIG. 6C, in the direction perpendicular to the base substrate, the power line protrusion 252 is not overlapped with the first electrode (namely the first electrode T3s of the third transistor) of the compensation subcircuit, so as to avoid the generation of parasitic capacitance. The parasitic capacitance is prone to cause too long charging time of the third node N3, so insufficient potential of the third node N3 can be caused, and then insufficient potential of the gate electrode of the first transistor T1 can be caused, and consequently threshold compensation can be affected. For instance, the power line protrusion 252 and the first electrode T3s of the third transistor are spaced apart from each other at a distance in the second direction D2, so as to avoid the production of parasitic capacitance (for instance, avoiding fringe field effects). For instance, the minimum spacing between the power line protrusion 252 and the first electrode T3s of the third transistor is 4.375 μm.

As shown in FIG. 6D, the plurality of data lines include first data lines 12a and second data lines 12b. The first data lines 12a and the second data lines 12b are respectively configured to provide data signals Vd for first subpixels 100a and second subpixels 100b, and the first data lines 12a and the second data lines 12b are respectively disposed on two sides of the power lines 250. As shown in FIG. 6D, in the direction perpendicular to the base substrate, the pixel electrode 134a of the first subpixel is not overlapped with the first data line 12a connected with the first subpixel but it is overlapped with the second data line 12b connected with the second subpixel.

For instance, in the first direction D1, the maximum dimension L1 of the power line protrusion 252 is 8 μm, and the minimum distance between the power line protrusion 252 and the second data line 12b is 8.51 μm.

As shown in FIG. 6D, the power line protrusion 252 is disposed between the power line main body 251 and the second data line 12b which are oppositely arranged relative to the pixel electrode 134a. For instance, the power line protrusion 252, the connecting electrode 231, the connecting electrode 232, and the second data line 12b are respectively disposed on four different sides of the pixel electrode 134a, so as to be relatively evenly arranged relative to the pixel electrode 134a, and the flatness of the pixel electrode 134a can be effectively improved.

As shown in FIG. 6D, the pixel electrode 134a of the first subpixel includes a first electrode main body 141 and an electrode protrusion 141a (one example of a first connecting part in the present disclosure); the first electrode main body 141 is configured to contact a light-emitting layer of the light-emitting element of the first subpixel; the protrusion 141a is electrically connected with the connecting electrode 232 through a via hole 340 (with reference to FIG. 3A and FIG. 7A, one example of a first via hole in the present disclosure); and the first electrode main body 141 is not overlapped with the via hole 340 in the direction perpendicular to the base substrate, so as to prevent the via hole 340 from affecting the flatness of the first electrode main body 141, and the display quality can be improved.

For instance, the first electrode main body 141 is a rectangle, and the length and the width of the rectangle are respectively parallel to the first direction D1 and the second direction D2. For instance, the power line protrusion 252, the connecting electrode 231, the connecting electrode 232 and the second data line 12b are respectively disposed on four sides of the rectangle.

It is to be noted that the electrode main body of the pixel electrode in the embodiment of the present disclosure refers to a part of the pixel electrode with maximum rectangular area, and no further description will be given below.

With reference to FIG. 6A and FIG. 6D, the power line 250 includes a bending part 253 (as shown by an elliptical dashed block in FIG. 6D), and the bending part 253 is, for instance, a U-shaped structure, or a V-shaped structure. The bending part 253 is bent towards the second data line 12b so as to form a depressed area on one side near the first data line 12a. For instance, the bending part 253 is at least partially overlapped with the pixel electrode 134b of the second subpixel in the direction perpendicular to the base substrate. As shown in FIG. 6D, an orthographic projection of the bending part 253 on the base substrate falls within an orthographic projection of the pixel electrode 134b of the second subpixel on the base substrate, so the bending part 253 increases the height of the pixel electrode 134b of the second subpixel, and the flatness of the pixel electrode 134b is improved.

As shown in FIG. 6B and FIG. 6D, a via hole region (namely an area that covers the via hole 346) on the first data line 12a is designed corresponding to the depressed area formed by the bending part 253, so the space utilization can be improved. For instance, the first data line 12a includes a data line main body extending along the second direction D2. As the line width of the data line main body is small, for the convenience of arranging the via hole, the first data line 12a also includes a data line protrusion 121 extending from the data line main body of the first data line. The data line protrusion 121 is protruded towards the depressed area and is at least partially overlapped with the via hole 346 in the direction perpendicular to the base substrate.

For instance, the data line protrusion 121 overlapped with the pixel electrode 134b of the second subpixel is connected with the subpixel below the second subpixel (namely the subpixel under the first subpixel) through the via hole 346 to provide the data signal Vd.

For instance, in the second direction D2, the power line protrusions 252 and the bending parts 253 are arranged alternately.

As shown in FIG. 6D, in the second direction D2, the minimum spacing between the power line protrusion 252 and the bending part 253 is greater than the minimum spacing between the pixel electrode 134a of the first subpixel and the pixel electrode 134b of the second subpixel.

As shown in FIG. 6D, the pixel electrode 134b of the second subpixel includes a second electrode main body 142 (as shown by a dashed block in the figure); the second electrode main body 142 is a rectangle; and a projection of an orthographic projection of the geometrical center O of the rectangle on the plane of the power line 250, on the power line, along the second direction D2 (along the direction showed by the dashed arrow) is disposed on the bending part 253.

For instance, as shown in FIGS. 6A-6B, the third conductive layer 203 also includes connecting electrodes 233; and one end of the connecting electrode 233 is electrically connected with the reset voltage line through a via hole 348, and the other end is electrically connected with the sixth transistor T6 through a via hole 347, so that a first electrode T6s of the sixth transistor T6 can receive the first reset voltage Vinit1 from the reset voltage line 240. For instance, the via hole 348 runs through the third insulating layer 303. For instance, the via hole 404 runs through the first insulating layer 301, the second insulating layer 302, and the third insulating layer 303.

For instance, as shown in FIG. 6B, first electrodes of seventh transistors T7 in the previous row of subpixels are electrically connected with the reset voltage line 240 corresponding to the current row of subpixels to receive the second reset voltage Vinit2, and first electrodes of seventh transistors T7 in the current row of subpixels are electrically connected with the reset voltage line 240 corresponding to the next row of subpixels to receive the second reset voltage Vinit2.

Figure 7A:
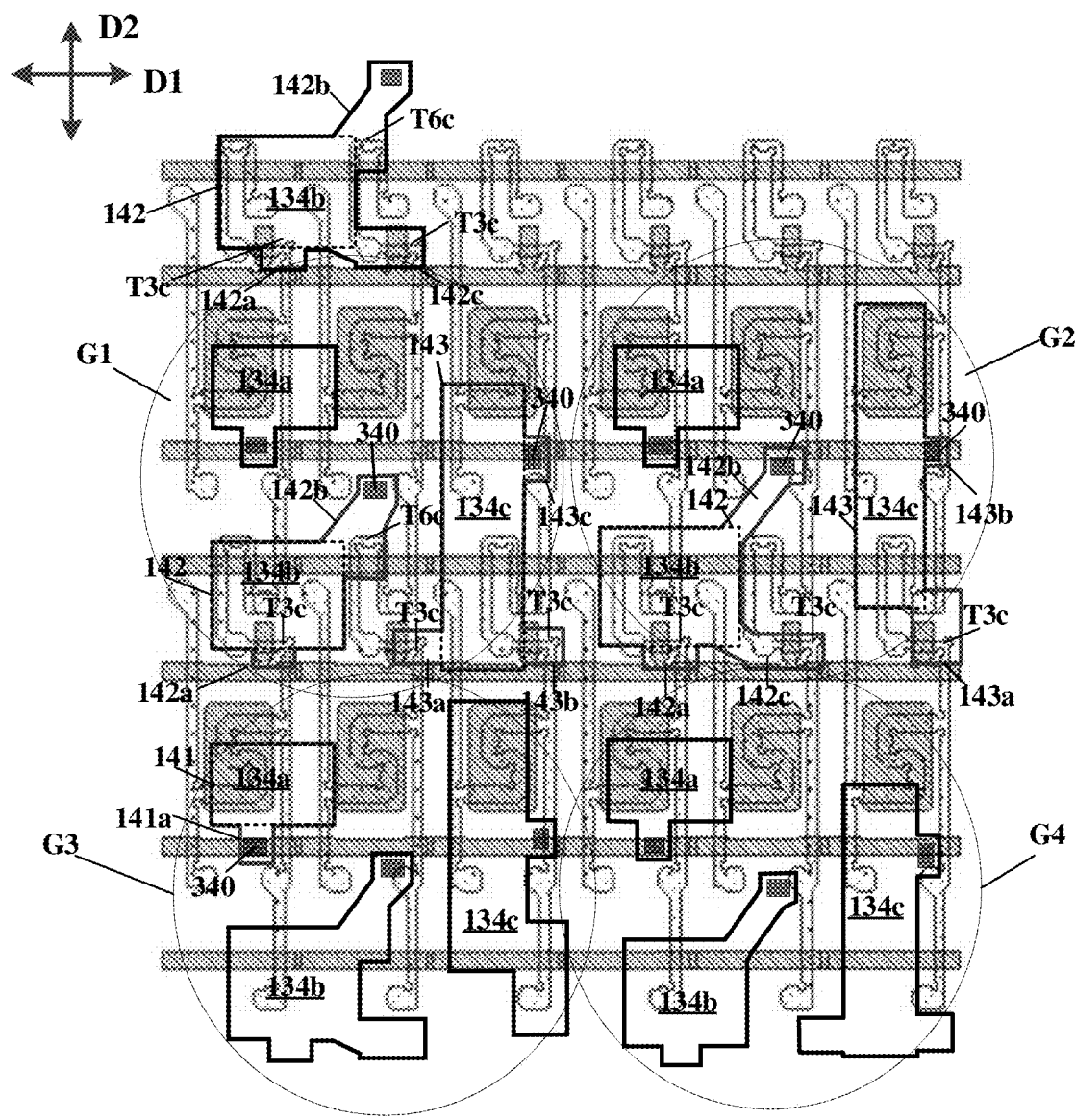
FIG. 7A is a tenth schematic diagram of the display substrate provided by at least one embodiment of the present disclosure.

FIG. 7A shows the semiconductor layer 102, the first conductive layer 201 and the fourth conductive layer 204 for the convenience of describing the relative positional relationships between the pixel electrodes of the light-emitting elements and the gate electrodes and the channel regions of the transistors in the embodiment of the present disclosure.

With reference to FIGS. 3A-3B and FIG. 7A, the fourth conductive layer 204 includes the first electrodes, namely the pixel electrodes 134, of the light-emitting elements, for instance, it includes the pixel electrodes 134a of the first subpixels 100a, the pixel electrodes 134b of the second subpixels 100b, and the pixel electrodes 134c of the third subpixels 100c. The pixel electrodes 134 of the subpixels are electrically connected with the connecting electrodes 232 in the subpixels through the via holes 340 and thus electrically connected with the second electrodes T5d of the fifth transistors T5 through the connecting electrodes 232. The via holes 340, for instance, run through the fourth insulating layer 304.

For instance, with reference to FIGS. 3A-3B, the display substrate 20 may further comprise pixel define layers (PDLs) 305 disposed on the pixel electrodes of the light-emitting elements. An opening is formed in the PDL 305 to expose at least part of the pixel electrode 134 so as to define an opening region (namely an effective light-emitting region) 600 of each subpixel of the display substrate. A light-emitting layer 136 of the light-emitting element 120 is at least formed in the opening (the light-emitting layer 136 may also cover partial surface on a side of the PDL away from the first electrode of the light-emitting element), and the second electrode 135 is formed on the light-emitting layer 136 so as to form the light-emitting element 120. For instance, the second electrode 135 is a common electrode and the whole of the second electrode 135 is arranged on the display substrate 20. For instance, the first electrode 134, the light-emitting layer 136, and the second electrode 135 of the light-emitting element 120 are sequentially stacked up, and the first electrode 134 is disposed on a side of the second electrode 135 near the base substrate 101. For instance, the pixel electrode 134 is an anode of the light-emitting element, and the second electrode 135 is a cathode of the light-emitting element.

FIG. 7A shows the position of the opening region 600 on the first electrode of the light-emitting element of each of the subpixels, and shows the position of the via hole 340 of the each of pixel electrodes relative to the pixel electrodes 134. As shown in FIG. 7A, orthographic projections of the via hole 340 and the opening region 600 on the base substrate 101 are not overlapped, that is, the orthographic projection of the via hole 340 on the base substrate 101 falls outside the opening region 600. As the via hole 340 is closer to the light-emitting layer 136 in the direction perpendicular to the base substrate 101, this arrangement prevents the via hole 340 from affecting the flatness of the light-emitting layer in the opening region to affect the light-emitting quality.

For instance, as shown in FIG. 3B, the via hole 349 and the via hole 340 are partially overlapped and not completely overlapped in the direction perpendicular to the base substrate 101, so as to avoid the problem of poor connection, disconnection, or unevenness at the position of the via holes due to the stacking of the via holes in the direction perpendicular to the base substrate 101. In some other examples, the via hole 349 and the via hole 340 are not overlapped in the direction perpendicular to the base substrate 101. In some examples, the via hole running through a given layer can be formed as that the dimension on one surface of the film layer is greater than the dimension on the other surface, and the range of the via hole may be the maximum dimension formed in a corresponding film layer.

For instance, the display substrate comprises a plurality of first subpixels 100a, a plurality of second subpixels 100b, and a plurality of third subpixels 100c, and a pixel electrode of each subpixel is electrically connected with a pixel circuit of the subpixel through a via hole 340. FIG. 7A illustratively shows the position of the via hole 340 in each pixel electrode. FIG. 7A also uses rectangular dashed blocks to respectively show a first electrode main body 141 of a pixel electrode 134a, a second electrode main body 142 of a pixel electrode 134b, and a third electrode main body 143 of a pixel electrode 134c; and parts of the pixel electrodes except the electrode main bodies are electrode protrusions of the pixel electrodes.

As shown in FIG. 7A, the pixel circuits and the pixel electrodes of the subpixels have different arrangement rules. For instance, the pixel circuits of the first subpixels and the pixel circuits of the second subpixels are arranged along the first direction, but the pixel electrodes of the first subpixels and the pixel electrodes of the second subpixels are arranged along the second direction.

For instance, as shown in FIG. 7A, in the first direction, the pixel electrodes of the first subpixels, the second subpixels, and the third subpixels are sequentially arranged; and in the second direction, the subpixels corresponding to each column of pixel circuits emit light of the same color.

Figure 7B:
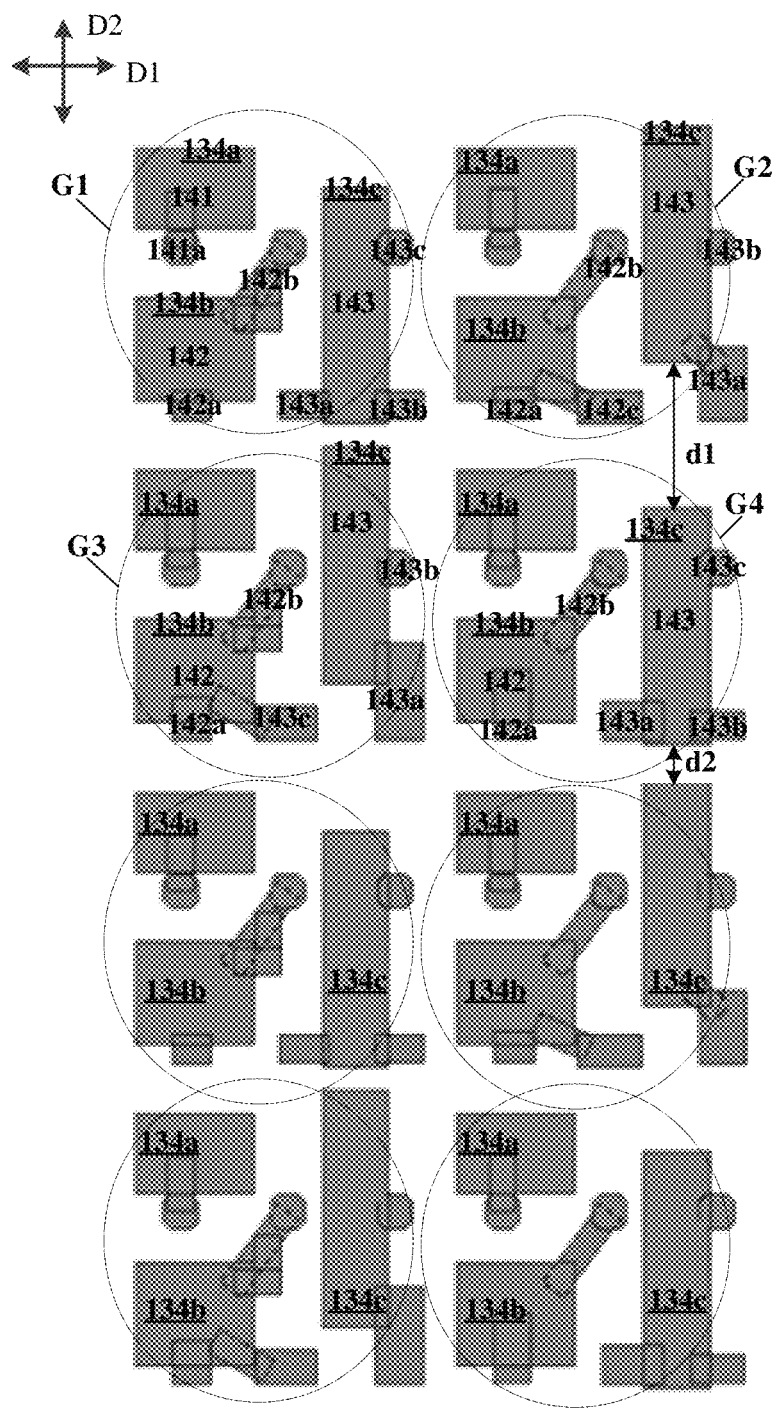
FIG. 7B is an eleventh schematic diagram of the display substrate provided by at least one embodiment of the present disclosure.

For instance, FIG. 7A shows four columns of pixel electrodes; and FIG. 7B is a schematic diagram showing pixel electrodes of four rows and six columns of subpixels. With reference to FIGS. 7A-7B, for instance, in the second direction, the pixel electrodes 134a of the first subpixels and the pixel electrodes 134b of the second subpixels are arranged alternately, or the pixel electrodes 134c of the third subpixels are sequentially arranged; and the two cases are alternately presented in the first direction. For instance, in the first direction, the pixel electrodes 134a of the first subpixels and the pixel electrodes 134c of the third subpixels are arranged alternately; or the pixel electrodes 134b of the second subpixels and the pixel electrodes 134c of the third subpixels are arranged alternately; and the two cases are alternately presented in the second direction.

For instance, the pixel electrode 134c of the third subpixel includes a third electrode main body 143. As shown in FIG. 7B, for one column of third subpixels, the spacing between the third electrode main bodies 143 of the pixel electrodes 134c of the third subpixels adjacent to each other in the second direction is not constant. As shown in FIG. 7B, the minimum spacing between the third electrode main bodies 143 of the pixel electrodes 134c of the adjacent third subpixels is the first spacing d1 and the second spacing d2 alternately, and the first spacing d1 is greater than the second spacing d2. As the subpixels on this column are configured to be the same color, when light-emitting layers of the third subpixels are formed by vapor deposition via a mask, the third subpixels with small spacing can share one mask mesh for vapor deposition so as to reduce the precision requirement on the mask.

For instance, the plurality of subpixels are divided into a plurality of pixel groups, and each pixel group includes a first subpixel, a second subpixel, and a third subpixel. For instance, each pixel group is configured to emit full-color light. For instance, the first subpixel, the second subpixel, and the third subpixel in each pixel group are disposed in the same row. FIG. 7B uses a circle to show the pixel electrodes of each pixel group. However, these will not be construed as the limitation of the present disclosure, and the pixel groups may also be divided according to other ways in actual circuits.

FIGS. 7A and 7B use circles to illustratively show the pixel groups. FIG. 7A uses circles to show a third pixel group G3, a fourth pixel group G4, a first pixel group G1, and a second pixel group G2 in the plurality of pixel groups; the third pixel group G3 and the fourth pixel group G3 are adjacent to each other in the first direction; the third pixel group G3 and the first pixel group G1 are adjacent to each other in the second direction; and the fourth pixel group G4 and the second pixel group G2 are adjacent to each other in the second direction.

For instance, in each pixel group, the pixel electrode 134a of the first subpixel, the pixel electrode 134b of the second subpixel, and the pixel electrode 134c of the third subpixel are triangularly arranged.

For instance, the pixel electrodes of at least one pair of corresponding subpixels in two pixel groups adjacent to each other in the first direction D1 or the second direction D2 have different shapes. For instance, the pixel electrodes of corresponding second subpixel and/or third subpixel in the two pixel groups have different shapes.

It is to be noted that corresponding subpixels in the plurality of pixel groups represent subpixels that emit light of the same color in the plurality of subpixels.

For instance, pixel electrodes of at least one pair of corresponding subpixels in two pixel groups disposed in adjacent rows and adjacent columns (namely the two pixel groups are obliquely opposite to each other) have same shape. For instance, the shapes of pixel electrodes of all the corresponding subpixels in the two pixel groups are respectively the same. For instance, the pixel electrodes of corresponding subpixels in the third pixel group G3 and the second pixel group G2 have same shape, and the pixel electrodes of corresponding subpixels in the fourth pixel group G4 and the first pixel group G1 have same shape.

For instance, the pixel electrodes 134a of the first subpixels are all the same.

For instance, as shown in FIG. 7A, the pixel electrode of the second subpixel in the third pixel group G3 and the pixel electrode of the second subpixel in the first pixel group G1 have different shapes, and the pixel electrode of the second subpixel in the third pixel group G3 and the pixel electrode of the second subpixel in the second pixel group G2 may have a same shape or have different shapes (different cases are shown in FIGS. 7A and 7B). For instance, the pixel electrode of the third subpixel in the third pixel group G3 and the pixel electrode of the third subpixel in the first pixel group G1 have different shapes, and the pixel electrode of the third subpixel in the third pixel group G3 and the pixel electrode of the third subpixel in the second pixel group G2 may have a same shape or have different shapes (different cases are shown in FIGS. 7A and 7B).

For instance, as shown in FIGS. 7A-7B, the pixel electrodes 134b of the plurality of second subpixels include first shape electrodes (e.g., with reference to second pixel electrodes 134b in the third pixel groups G3) and second shape electrodes (e.g., with reference to second pixel electrodes 134b in the first pixel groups G1 or the fourth pixel groups G4). For instance, the first shape electrodes and the second shape electrodes include second electrode main bodies 142 with a same shape, but include different electrode protrusions (142a, 142b, 142c) extending out from the second electrode main bodies 142.

For instance, the pixel electrodes 134c of the plurality of third subpixels include third shape electrodes (e.g., with reference to third pixel electrodes 134c in the third pixel groups G3) and fourth shape electrodes (e.g., with reference to second pixel electrodes 134b in the first pixel groups G1 or the fourth pixel group G4). For instance, the third shape electrodes and the fourth shape electrodes include third electrode main bodies 143 with the same shape, but include different electrode protrusions (143a, 143b, 143c) extending out from the third electrode main bodies 143.

For instance, the first shape electrodes and the second shape electrodes are alternately arranged in the first direction D1 and/or the second direction D2. For instance, the third shape electrodes and the fourth shape electrodes are alternately arranged in the first direction D1 and/or the second direction D2.

As the third transistor T3 and the sixth transistor T6 are respectively electrically connected with the gate electrode of the first transistor T1 (the driving transistor), the third transistor T3 and the sixth transistor T6 directly affect the stability of the gate voltage of the driving transistor. For instance, in the case of unstable performance of the third transistor T3 or the sixth transistor T6, a charge leakage path may be formed, causing insufficient compensation of the first transistor, resulting in uneven display.

As the materials of both the conduction region T3c of the third transistor and the conduction region T6c of the sixth transistor T6 include semiconductor materials, unstable phenomena, such as threshold drift and leakage, tend to occur under illumination, at least one embodiment of the present disclosure also designs the pixel electrode to shield the conduction region T3c of the third transistor and/or the conduction region T6c of the sixth transistor T6 of the subpixel, so as to improve the stability of the compensation transistor, thereby improving the display quality.

For instance, in at least one embodiment of the present disclosure, the pixel electrode is made from non-transparent material and has good light shielding effect. For instance, the pixel electrode includes a stack layer structure of transparent conductive materials and metallic materials.

As shown in FIG. 7A, the conduction region T3c of the third transistor of the first subpixel (for instance, with reference to the first subpixel in the third pixel group G3) is at least partially overlapped with the pixel electrode 134b of one second subpixel (for instance, with reference to the second subpixel in the first pixel group G1) in the direction perpendicular to the base substrate, and the second subpixel and the first subpixel are disposed in adjacent rows and adjacent columns (namely the second subpixel and the first subpixel are obliquely opposite to each other).

It is to be noted that as shown in FIG. 7A, the arrangement rule of the pixel circuits of the subpixels is not the same as the arrangement rule of the pixel electrodes (134a, 134b, and 134c) of the subpixels. For the convenience of description, the description on the arrangement of the subpixels here refer to the arrangement rule of the pixel circuits. For instance, adjacent subpixels refer to subpixels with adjacent pixel circuits.

For instance, as shown in FIGS. 7A-7B, the pixel electrode 134b of the second subpixel (for instance, the second subpixel in the first pixel group G1) includes an electrode protrusion 142a and an electrode protrusion 142b which extend out from the second electrode main body 142. As can be seen from FIGS. 7A-7B, the electrode protrusion 142a is protruded from the lower side of the rectangular second electrode main body 142, and the electrode protrusion 142b is protruded from the top right corner of the rectangular second electrode main body 142. In the direction perpendicular to the base substrate, the electrode protrusion 142a covers the conduction region T3c of the third transistor T3 of the first subpixel (for instance, with reference to the first subpixel in the third pixel group G3) on the bottom left corner of the second subpixel. The protrusion 142b extends along the top right direction so as to be electrically connected with the pixel circuit of the second subpixel through the via hole 340. For instance, in the direction perpendicular to the base substrate, the electrode protrusion 142b is also at least partially overlapped with the conduction region T6c of the sixth transistor T6 of another second subpixel (for instance, with reference to the second subpixel in the third pixel group G3) right under this second subpixel. For instance, the electrode protrusion 142b covers the conduction region T6c of the sixth transistor T6 of the adjacent second subpixel. For instance, in this case, the pixel electrode 134b of the second subpixel is the first shape electrode.

For instance, as shown in FIGS. 7A-7B, the pixel electrode 134b of the second subpixel (for instance, with reference to the second subpixel in the second pixel group G2 or the second subpixel over the first pixel group G1) may also include an electrode protrusion 142c which is protruded from the bottom right corner of the rectangular electrode main body of the pixel electrode 134b, for instance, the electrode protrusion 142c extends along the first direction D1. For instance, in the direction perpendicular to the base substrate, the electrode protrusion 142c is at least partially overlapped with the conduction region T3c of the third transistor T3 of another second subpixel (for instance, with reference to the second subpixel in the fourth pixel group G4) right under this second subpixel. For instance, the electrode protrusion 142c covers the conduction region T3c of the third transistor T3 of the adjacent second subpixel.

For instance, as shown in FIGS. 7A-7B, in one case, in the direction perpendicular to the base substrate, the conduction region T3c of the third transistor of the second subpixel (for instance, with reference to the second subpixel in the fourth pixel group G4) is at least partially overlapped with the pixel electrode 134b of the second subpixel (one example of the fourth subpixel in the present disclosure, for instance, with reference to the second subpixel in the second pixel group G2) over the second subpixel (namely in the same column); and in another case, in the direction perpendicular to the base substrate, the conduction region T3c of the third transistor of the second subpixel (for instance, with reference to the second subpixel in the third pixel group G3) is at least partially overlapped with the pixel electrode 134c of one third subpixel (with reference to the third subpixel in the first pixel group G1), and the third subpixel and the second subpixel are disposed in adjacent rows and adjacent columns (namely the third subpixel and the second subpixel are obliquely opposite to each other).

For instance, as shown in FIGS. 7A-7B, the pixel electrode 134c of the third subpixel (for instance, with reference to the third subpixel in the second pixel group G2) includes an electrode protrusion 143a and an electrode protrusion 143b which extend out from the third electrode main body 143. As can be seen from FIGS. 7A-7B, the electrode protrusion 143a is protruded from the bottom right corner of the rectangular third electrode main body 143, and the electrode protrusion 143b is protruded from the right side of the rectangular third electrode main body 143. In the direction perpendicular to the base substrate, the electrode protrusion 143a covers the conduction region T3c of the third transistor T3 of another third subpixel (for instance, with reference to the third subpixel in the fourth pixel group G4) under this second subpixel. The protrusion 143b extends along the first direction so as to be electrically connected with the pixel electrode of the third subpixel through the via hole 340. For instance, in order to achieve better coverage effect, in actual design, the electrode protrusion 143a may fluctuate in different subpixels. For instance, in this case, the pixel electrode 134c of the third subpixel is the third shape electrode.

For instance, as shown in FIGS. 7A-7B, in another case, the pixel electrode 134c of the third subpixel (for instance, with reference to the third subpixel in the first pixel group G1) includes an electrode protrusion 143a, an electrode protrusion 143b, and an electrode protrusion 143c which extend out from the third electrode main body 143. For instance, the electrode protrusion 143a and the electrode protrusion 143b are respectively protruded from two opposite sides of the third electrode main body 143 in the first direction D1. For instance, as can be seen from FIGS. 7A-7B, the electrode protrusion 143a is protruded from the left side of the rectangular third electrode main body 143, and the electrode protrusion 143b is protruded from the right side of the third electrode main body 143. In the direction perpendicular to the base substrate, the electrode protrusion 143a covers the conduction region T3c of the third transistor T3 of the second subpixel (with reference to the second subpixel in the third pixel group G3) on the bottom left corner of the third subpixel; and the protrusion 143b covers the conduction region T3c of the third transistor T3 of the third subpixel (with reference to the third subpixel in the third pixel group G3) right under this third subpixel. The electrode protrusion 143c is protruded from the right side (for instance, the middle part) of the rectangular third electrode main body 143 and electrically connected with the pixel circuit of the third subpixel through the via hole 340. For instance, in order to achieve better coverage effect, in actual design, the electrode protrusions 143a and 143b may fluctuate in different subpixels. For instance, in this case, the pixel electrode 134c of the third subpixel is the fourth shape electrode.

For instance, the conduction region T3c of the third transistor of the third subpixel (for instance, with reference to the third subpixel in the fourth pixel group G4) is at least partially overlapped with the pixel electrode 134c of another third subpixel (one example of the fifth subpixel in the present disclosure, for instance, with reference to the third subpixel in the second pixel group G2) over the third subpixel in the direction perpendicular to the base substrate. For instance, in the direction perpendicular to the base substrate, the conduction region T3c of the third transistor of the third subpixel is covered by the pixel electrode 134c of another third subpixel.

At least one embodiment of the present disclosure also provides a display substrate, which comprises a base substrate and a plurality of subpixels distributed on the base substrate in an array. Each of the plurality of subpixels includes a pixel circuit configured to drive a light-emitting element corresponding to each of the plurality of subpixels. The pixel circuits of the plurality of subpixels are arranged along a first direction and a second direction, the first direction and the second direction are different. Each of the plurality of subpixels further includes a pixel electrode which is a first electrode of the light-emitting element corresponding to each subpixel. The pixel electrode and the pixel circuit of the each subpixel are electrically connected with each other. Each pixel circuit includes a driving subcircuit, a data write subcircuit and a compensation subcircuit. The driving subcircuit includes a control terminal, a first terminal, and a second terminal and is configured to be connected with the light-emitting element and control the driving current flowing across the light-emitting element. The data write subcircuit is connected with the driving subcircuit and configured to write a data signal into the first terminal of the driving subcircuit in response to a first scanning signal. The compensation subcircuit is connected with the driving subcircuit and configured to perform threshold compensation on the driving subcircuit in response to a second scanning signal. The plurality of subpixels are divided into a plurality of pixel groups. Each of the plurality of pixel groups includes a first subpixel, a second subpixel, and a third subpixel which are respectively configured to emit light of different colors. The plurality of pixel groups include first pixel groups and second pixel groups which are adjacent to each other in the first direction. Pixel electrodes of at least one subpixel in the first pixel group and a corresponding subpixel in the second pixel group have different shapes. Moreover, pixel electrodes of at least one subpixel in the first pixel group and a corresponding subpixel in the second pixel group have same shape.

For instance, each pixel group is configured to emit full-color light. For instance, the first subpixel, the second subpixel, and the third subpixel in each pixel group are disposed in the same row. However, these do not limit the present disclosure, and in actual circuits, the pixel groups may be divided according to other ways.

For instance, as shown in FIGS. 7A-7B, the pixel electrodes of the first subpixel in the first pixel group G1 and the first subpixel in the second pixel group G2 have same shape; and the second subpixel and the third subpixel in the first pixel group G1 and the second subpixel and the third subpixel in the second pixel group G2 include pixel electrodes of different shapes, respectively.

For instance, as shown in FIGS. 7A-7B, the second subpixel and the third subpixel in the first pixel group G1 and the second subpixel and the third subpixel in the third pixel group G3 include pixel electrodes of different shapes, respectively.

For instance, as shown in FIGS. 7A-7B, the second subpixel and the third subpixel in the first pixel group G1 and the second subpixel and the third subpixel in the fourth pixel group G3 include pixel electrodes of different shapes, respectively.

For instance, as shown in FIGS. 7A-7B, the second subpixel and the third subpixel in the second pixel group G2 and the second subpixel and the third subpixel in the third pixel group G3 include pixel electrodes of different shapes, respectively.

For instance, the pixel electrodes 134a of the first subpixels are all the same.

In some other examples, the shape of the pixel electrodes of corresponding subpixels in the first pixel group G1 and the fourth pixel group G4 may be respectively the same; and the shape of the pixel electrodes of corresponding subpixels in the third pixel group G3 and the second pixel group G2 may be the same, respectively.

For instance, as shown in FIGS. 7A-7B, in the direction perpendicular to the base substrate, the conduction region T3c of the third transistor of the first subpixel in the third pixel group G3 is at least partially overlapped with the pixel electrode 134b of the second subpixel in the first pixel group G1. For instance, in order to achieve better light shielding effect, in the direction perpendicular to the base substrate, the pixel electrode 134b of the second subpixel in the first pixel group G1 completely covers the conduction region T3c of the third transistor of the first subpixel in the third pixel group G3.

For instance, as shown in FIGS. 7A-7B, in the direction perpendicular to the base substrate, the conduction regions T3c of the third transistors of the second subpixel and the third subpixel in the third pixel group G3 are at least partially overlapped with the pixel electrode 134c of the third subpixel in the first pixel group G1, respectively. For instance, in order to achieve better light shielding effect, in the direction perpendicular to the base substrate, the pixel electrode 134c of the third subpixel in the first pixel group G1 completely covers the conduction regions T3c of the third transistors of the second subpixel and the third subpixel in the third pixel group G3.

For instance, as shown in FIGS. 7A-7B, the pixel electrode 134c of the third subpixel in the first pixel group G1 includes a third electrode main body 143 and an electrode protrusion 143a (one example of the first electrode protrusion in the present disclosure) and an electrode protrusion 143b (one example of the second electrode protrusion in the present disclosure) which extend out from the third electrode main body 143. In the direction perpendicular to the base substrate, the electrode protrusion 143a and the electrode protrusion 143b are respectively at least partially overlapped with the conduction regions T3c of the third transistors of the second subpixel and the third subpixel in the third pixel group G3. For instance, in order to achieve better light shielding effect, in the direction perpendicular to the base substrate, the electrode protrusion 143a and the electrode protrusion 143b respectively completely cover the conduction regions T3c of the third transistors of the second subpixel and the third subpixel in the third pixel group G3.

For instance, as shown in FIGS. 7A-7B, the conduction regions T3c of the third transistors of the first subpixel and the second subpixel in the fourth pixel group G4 are respectively at least partially overlapped with the pixel electrode 134b of the second subpixel in the second pixel group G2. For instance, in order to achieve better light shielding effect, in the direction perpendicular to the base substrate, the pixel electrode 134b of the second subpixel in the second pixel group G2 completely covers the conduction regions T3c of the third transistors of the first subpixel and the second subpixel in the fourth pixel group G4.

For instance, as shown in FIGS. 7A-7B, the pixel electrode 134b of the second subpixel in the second pixel group G2 includes a second electrode main body 142 and an electrode protrusion 142a (one example of the third electrode protrusion in the present disclosure) and an electrode protrusion 142c (one example of the fourth electrode protrusion in the present disclosure) which extend out from the second electrode main body. In the direction perpendicular to the base substrate, the electrode protrusion 142a and the electrode protrusion 142c are respectively at least partially overlapped with the conduction regions T3c of the third transistors of the first subpixel and the second subpixel in the fourth pixel group G4. For instance, in order to achieve better light shielding effect, in the direction perpendicular to the base substrate, the electrode protrusion 142a and the electrode protrusion 142c respectively completely cover the conduction regions T3c of the third transistors of the first subpixel and the second subpixel in the fourth pixel group G4.

For instance, as shown in FIGS. 7A-7B, the conduction region T3c of the third transistor of the third subpixel in the fourth pixel group G4 is at least partially overlapped with the pixel electrode 134b of the second subpixel in the second pixel group G2. For instance, the pixel electrode 134b of the second subpixel in the second pixel group G2 includes an electrode protrusion 143a which is at least partially overlapped with the conduction region T3c of the third transistor of the third subpixel in the fourth pixel group G4 in the direction perpendicular to the base substrate. For instance, in order to achieve better light shielding effect, in the direction perpendicular to the base substrate, the electrode protrusion 143a of the pixel electrode 134 of the second subpixel in the second pixel group G2 completely covers the conduction region T3c of the third transistor of the third subpixel in the fourth pixel group G4.

For instance, as shown in FIGS. 7A-7B, the minimum spacing between the electrode main bodies of the pixel electrodes of the third subpixels in the first pixel group G1 and the third pixel group G3 is smaller than the minimum spacing between the electrode main bodies of the pixel electrodes of the third subpixels in the second pixel group G2 and the fourth pixel group G4.

For instance, the shape and the dimension of the plurality of opening regions of the subpixels 100 may be designed according to the light-emitting efficiency, the service life, and the like, of light-emitting materials that emit light of different colors. For instance, the opening regions corresponding to the luminescent materials with short service life or low luminescent efficiency may be designed to be large, so as to improve the luminescent stability. For instance, the dimension of the opening regions of red subpixels, green subpixels, and blue subpixels may be designed to be increased sequentially. As the area of the opening area is equivalent to that of the main body of the pixel electrode, correspondingly, as shown in FIGS. 7A-7B, the areas of the pixel electrodes 134a, 134b, and 134c of the first subpixel 100a, the second subpixel 100b, and the third subpixel 100c are increased sequentially.

For instance, the base substrate 101 may be a rigid substrate, such as a glass substrate, a silicon substrate, or the like, or may be made from flexible materials with superior heat resistance and durability, such as polyimide (PI), polycarbonate (PC), polyethylene terephthalate (PET), polyethylene, polyacrylate, polyarylate, polyetherimide, polyether sulfone, polyethylene glycol terephthalate (PET), polyethylene (PE), polypropylene (PP), polysulfone (PSF), polymethyl methacrylate (PMMA), triacetyl cellulose (TAC), cycloolefin polymer (COP), and cycloylene copolymer (COC).

For instance, the material of the semiconductor layer 102 includes but not limited to silica-base materials (amorphous silicon a-Si, polysilicon P—Si, etc.), metal oxide semiconductors (indium gallium zinc oxide (IGZO), zinc oxide (ZnO), aluminum zinc oxide (AZO), indium zinc tin oxide (IZTO), etc.) and organic materials (sexithiophene, polythiophene, etc.).

For instance, the materials of the first conductive layer 201, the second conductive layer 202, the third conductive layer 203, and the fourth conductive layer 204 respectively may include gold (Au), silver (Ag), copper (Cu), aluminum (Al), molybdenum (Mo), magnesium (Mg), tungsten (W), and alloy materials composed of the above metals; or conductive metal oxide materials, such as indium tin oxide (ITO), indium zinc oxide (IZO), zinc oxide (ZnO), aluminum zinc oxide (AZO), etc.

For instance, the light-emitting element 120 is a top-emission structure, and the first electrode (namely the pixel electrode) 134 has reflectivity and the second electrode 135 has transmittance or semi-transmittance. For instance, the first electrode 134 is an anode and the second electrode 135 is a cathode. For instance, the first electrode 134 is an ITO/Ag/ITO stack layer structure; transparent conductive material ITO is a material with high work function which can improve the hole injection rate when the ITO material directly contacts luminescent materials; and metallic material Ag can improve the reflectivity of the first electrode. For instance, the second electrode 135 uses materials with low work function as the cathode, for instance, the second electrode is made from semi-transmissive metal or metal alloy materials, such as Ag/Mg alloy materials.

For instance, the first insulating layer 301, the second insulating layer 302, and the third insulating layer 303 are, for instance, inorganic insulating layers. For instance, the three insulating layers are made from insulating materials, such as oxide, nitride, or oxynitride of silicon including silicon oxide, silicon nitride, or silicon oxynitride, or made from insulating materials, such as metal oxide or metal nitride including aluminum oxide, titanium nitride, etc. For instance, the fourth insulating layer 304 and the PDL 305 are respectively organic insulating materials, such as PI, acrylate, epoxy resin, or PMMA. For instance, the fourth insulating layer 304 is a planarization layer. For instance, the fourth insulating layer 304 includes photoresist material.

At least one embodiment of the present disclosure also provides a display panel, which comprises any foregoing display substrate 20. For instance, the display panel is an OLED display panel, and correspondingly, the display substrate of the display panel is an OLED display substrate. The display substrate 20 may include light-emitting elements or may not include light-emitting elements, that is, the light-emitting elements may be formed in a panel factory after the display substrate 20 is finished. When the display substrate 20 does not include the light-emitting elements, the display panel provided by the embodiment of the present disclosure may further comprise the light-emitting elements in addition to the display substrate 20.

Figure 8:
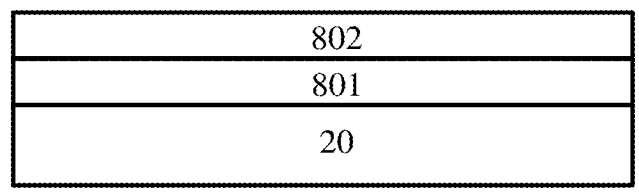
FIG. 8 is a schematic diagram of the display panel provided by at least one embodiment of the present disclosure.

As shown in FIG. 8, for instance, the display panel 30 further comprises an encapsulation layer 801 and a cover plate 802 disposed on the display substrate 20. The encapsulation layer 801 is configured to seal the light-emitting elements on the display substrate 20 to prevent external moisture or oxygen from penetrating the light-emitting elements and the driving subcircuits and damaging the components. For instance, the encapsulation layer 801 includes an organic film or is a structure which is stacked by an inorganic film, an organic film, and an inorganic film alternately. For instance, a water absorption layer (not shown) may also be disposed between the encapsulation layer 801 and the display substrate 20 and is configured to absorb residual water vapor or sol of the light-emitting elements in the previous preparing processes.

The cover plate 802 is, for instance, a glass cover or a flexible cover. For instance, the cover plate 802 and the encapsulation layer 801 may be an integrated structure.

Figure 9:
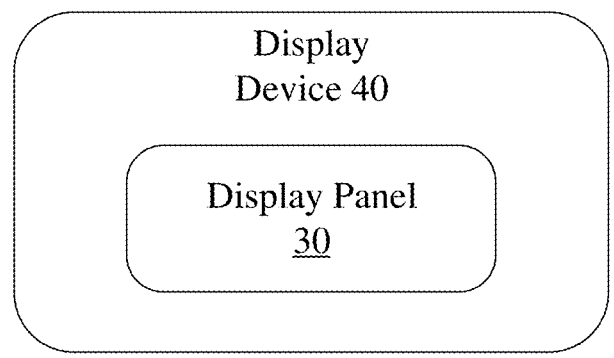
FIG. 9 is a schematic diagram of the display device provided by at least one embodiment of the present disclosure.

At least one embodiment of the present disclosure also provides a display device 40. As shown in FIG. 9, the display device 40 comprises any foregoing display substrate 20 or display panel 30. The display device in the embodiment may be any product or component with display function, such as a display, an OLED panel, an OLED TV, e-paper, a mobile phone, a tablet computer, a notebook computer, a digital album, or a navigator.

The foregoing is only the exemplary embodiments of the present disclosure and not intended to limit the scope of the present disclosure. The scope of the present disclosure is defined by the appended claims.

What is claimed is:
1. A display substrate, comprising:
    a base substrate; and
    a plurality of subpixels on the base substrate, wherein each of the plurality of subpixels incudes a pixel circuit which is configured to drive a light-emitting element corresponding to the each of the plurality of subpixels, the pixel circuits of the plurality of subpixels are arranged in an array along a first direction and a second direction, the first direction and the second direction are different;
    the each of the plurality of subpixels further comprises a pixel electrode which is a first electrode of the light-emitting element corresponding to the each of the plurality of subpixels, the pixel electrode and the pixel circuit of the each of the plurality of subpixels are electrically connected with each other;
    each pixel circuit comprises a driving subcircuit, a data write subcircuit, and a compensation subcircuit, the driving subcircuit comprises a control terminal, a first terminal, and a second terminal and the driving subcircuit is configured to be connected with the light-emitting element and control a driving current flowing across the light-emitting element; the data write subcircuit is connected with the driving subcircuit and the data write subcircuit is configured to write a data signal into the first terminal of the driving subcircuit in response to a first scanning signal; the compensation subcircuit is connected with the driving subcircuit and configured to perform threshold compensation on the driving subcircuit in response to a second scanning signal;
    the plurality of subpixels comprise first subpixels; the display substrate further comprises power lines which are configured to provide a first supply voltage for the first subpixels;
    each power line is provided on one side of the pixel electrode of a corresponding first subpixel near the base substrate, and the each power line comprises a power line main body extending along the second direction and a power line protrusion protruded from the power line main body, and the power line protrusion and the pixel electrode of the first subpixel are at least partially overlapped in a direction perpendicular to the base substrate.

2. The display substrate according to claim 1, wherein the first subpixel further comprises a first connecting electrode and a second connecting electrode; the first connecting electrode, the second connecting electrode, and the power line are arranged in the same layer and insulated from each other;
    the first connecting electrode is respectively electrically connected with the pixel circuit and the pixel electrode of the first subpixel so as to electrically connect the pixel circuit and the pixel electrode of the first subpixel;
    the second connecting electrode is respectively electrically connected with the control terminal of the driving subcircuit and the compensation subcircuit of the first subpixel so as to electrically connect the compensation subcircuit and the control terminal of the driving subcircuit of the first subpixel; and
    the first connecting electrode and the second connecting electrode are respectively at least partially overlapped with the pixel electrode of the first subpixel in the direction perpendicular to the base substrate.

3. The display substrate according to claim 2, wherein the power line protrusion is protruded from the power line main body along the first direction and provided between the first connecting electrode and the second connecting electrode in the second direction;
    the power line protrusion is respectively at least partially overlapped with the first connecting electrode and the second connecting electrode in the second direction; and
    in the second direction, the proportion ratio between a maximum dimension of the power line protrusion and a minimum spacing between the first connecting electrode and the second connecting electrode is 0.4-0.8.

4. The display substrate according to claim 2, wherein the pixel electrode of the first subpixel comprises a first electrode main body and a first connecting part, the first electrode main body is configured to contact a light-emitting layer of the light-emitting element corresponding to the first subpixel, the first connecting part of the pixel electrode is electrically connected with the first connecting electrode through a first via hole, and the first electrode main body and the first via hole are not overlapped with each other in the direction perpendicular to the base substrate; and wherein the first electrode main body is a rectangle, and a length and a width of the rectangle are respectively parallel to the first direction and the second direction.

5. The display substrate according to claim 1, wherein the compensation subcircuit comprises a control electrode, a first electrode, and a second electrode, the first electrode and the second electrode of the compensation subcircuit are respectively electrically connected with the second terminal and the control terminal of the driving subcircuit;

the first electrode of the compensation subcircuit comprises conducted semiconductor materials; and the power line protrusion and the first electrode of the compensation subcircuit are not overlapped in the direction perpendicular to the base substrate; and wherein the plurality of subpixels further comprise second subpixels, and the second subpixels and the first subpixels are adjacent to each other in the first direction;

the display substrate further comprises first data lines and second data lines extending along the second direction, the first data lines and the second data lines are respectively configured to provide data signals for the first subpixels and the second subpixels; and each first data line and a corresponding second data line are respectively provided on two sides of a corresponding power line, and the second data line and the pixel electrode of the first subpixel are at least partially overlapped in the direction perpendicular to the base substrate.

6. The display substrate according to claim 5, wherein the power line protrusion is provided between the power line main body and the second data line;

the pixel electrode of the second subpixel is respectively at least partially overlapped with the power line and the second data line in the direction perpendicular to the base substrate;

the power line comprises a bending part which is bent towards the second data line to form a depressed area, and the bending part is at least partially overlapped with the pixel electrode of the second subpixel in the direction perpendicular to the base substrate.

7. The display substrate according to claim 6, wherein, in the second direction, a minimum spacing between the power line protrusion and the bending part is greater than the minimum spacing between the pixel electrode of the first subpixel and the pixel electrode of the second subpixel; and the pixel electrode of the second subpixel comprises a second electrode main body which is a rectangle; and a projection of an orthographic projection of a geometrical center of the rectangle on the plane of the power line, on the power line along the second direction is on the bending part.

8. The display substrate according to claim 6, wherein the plurality of subpixels also comprise adjacent subpixels of the first subpixels adjacent to each other in the second direction;

the first data line is configured to be connected with the data subcircuits of the adjacent subpixels through a second via hole to provide a data signal for the adjacent subpixels;

the first data line comprises a data line main body extending along the second direction and a data line protrusion extending out from the data line main body, the data line protrusion and the second via hole are at least partially overlapped with each other in the direction perpendicular to the base substrate; and the data line protrusion is protruded towards the depressed area of the bending part of the power line.

9. The display substrate according to claim 6, wherein the power line comprises a plurality of power line protrusions and a plurality of bending parts; and the plurality of power line protrusions and the plurality of bending parts are alternately arranged in the second direction.

10. The display substrate according to claim 1, wherein the plurality of subpixels comprise a plurality of first subpixels, a plurality of second subpixels, and a plurality of third subpixels, and the first subpixels, the second subpixels and the third subpixels are respectively configured to emit light of different colors;

in the second direction, pixel electrodes of the first subpixels and pixel electrodes of the second subpixels are alternately arranged; or pixel electrodes of the third subpixels are sequentially arranged; and wherein, in the first direction, the pixel electrodes of the first subpixels and the pixel electrodes of the third subpixels are alternately arranged; or the pixel electrodes of the second subpixels and the pixel electrodes of the third subpixels are alternately arranged.

11. The display substrate according to claim 10, wherein the pixel electrodes of the plurality of second subpixels comprise first shape electrodes and second shape electrodes, and the pixel electrodes of the plurality of third subpixels comprise third shape electrodes and fourth shape electrodes;

the first shape electrodes and the second shape electrodes are alternately arranged in the first direction or the second direction; and the third shape electrodes and the fourth shape electrodes are alternately arranged in the first direction or the second direction.

12. The display substrate according to claim 10, wherein the pixel electrodes of the plurality of second subpixels are arranged in a pixel electrode array in the first direction and the second direction, the pixel electrodes of the plurality of second subpixels comprise first shape electrodes, second shape electrodes, third shape electrodes, and fourth shape electrodes;

the pixel electrode array comprises a first pixel electrode array and a second pixel electrode array, in the first pixel electrode array, the first shape electrodes and the second shape electrodes are alternately arranged in the second direction, and in the second pixel electrode array, the third shape electrodes and the fourth shape electrodes are alternately arranged in the second direction.

13. The display substrate according to claim 1, wherein the compensation subcircuit comprises a compensation transistor;

the compensation transistor comprises a first gate electrode, a second gate electrode, and a conduction region disposed between the first gate electrode and the second gate electrode; the conduction region comprises conducted semiconductor materials; the plurality of subpixels further comprise second subpixels and third subpixels; and the first subpixels, the second subpixels, and the third subpixels are respectively configured to emit light of different color;

the second subpixels and the first subpixels are disposed in adjacent pixel rows and adjacent pixel columns; and the conduction region of the compensation transistor of each first subpixel is at least partially overlapped with the pixel electrode of a corresponding second subpixel in the direction perpendicular to the base substrate.

14. The display substrate according to claim 13, wherein the plurality of subpixels further comprise fourth subpixels; the fourth subpixels and the second subpixels are adjacent to each other in the second direction and configured to emit light of a same color;

in the direction perpendicular to the base substrate, the conduction region of the compensation transistor of each second subpixel is at least partially overlapped with the pixel electrode of a corresponding fourth subpixel or the pixel electrode of a corresponding third subpixel; and the third subpixels and the second subpixels are disposed in adjacent pixel rows and adjacent pixel columns;

the plurality of subpixels also comprise fifth subpixels; the fifth subpixels and the third subpixels are adjacent to each other in the second direction and configured to emit light of the same color; and the conduction region of the compensation transistor of each third subpixel is at least partially overlapped with the pixel electrode of a corresponding fifth subpixel in the direction perpendicular to the base substrate.

15. A display substrate, comprising:

a base substrate; and a plurality of subpixels distributed in an array on the base substrate, wherein each of the plurality of subpixels comprises a pixel circuit which is configured to drive a light-emitting element corresponding to each of the plurality of subpixels; the pixel circuits of the plurality of subpixels are arranged along a first direction and a second direction, the first direction and the second direction are different;

each of the plurality of subpixels also comprises a pixel electrode which is a first electrode of the light-emitting element corresponding to each subpixel, and the pixel electrode and the pixel circuit of each subpixel is electrically connected with each other;

each pixel circuit comprises a driving subcircuit, a data write subcircuit, and a compensation subcircuit;

the driving subcircuit comprises a control terminal, a first terminal, and a second terminal, and is configured to be connected with the light-emitting element and control the driving current flowing across the light-emitting element;

the data write subcircuit is connected with the driving subcircuit and configured to write a data signal into the first terminal of the driving subcircuit in response to a first scanning signal;

the compensation subcircuit is connected with the driving subcircuit and configured to perform threshold compensation on the driving subcircuit in response to a second scanning signal;

the plurality of subpixels are divided into a plurality of pixel groups, each of the plurality of pixel groups comprises a first subpixel, a second subpixel, and a third subpixel, which are respectively configured to emit light of different colors;

the plurality of pixel groups comprise first pixel groups and second pixel groups adjacent to each other in the first direction, pixel electrodes of at least one subpixel in the first pixel group and corresponding subpixel in the second pixel group have different shapes; and pixel electrodes of at least one subpixel in the first pixel group and corresponding subpixel in the second pixel group have same shape.

16. The display substrate according to claim 15, wherein pixel electrodes of the first subpixel in the first pixel group and the first subpixel in the second pixel group have same shape;

pixel electrodes of the second subpixel and the third subpixel in the first pixel group have different shapes from those of pixel electrodes of the second subpixel and the third subpixel in the second pixel group;

the compensation subcircuit comprises a compensation transistor, the compensation transistor comprises a first gate electrode, a second gate electrode, and a conduction region disposed between the first gate electrode and the second gate electrode, and the conduction region comprises conducted semiconductor materials;

the plurality of pixel groups also comprise third pixel groups and fourth pixel groups adjacent to each other in the first direction, the third pixel groups and the first pixel groups are adjacent to each other in the second direction, and the fourth pixel groups and the second pixel groups are adjacent to each other in the second direction; and in a direction perpendicular to the base substrate, the conduction regions of the compensation transistors of the first subpixels in the third pixel groups are at least partially overlapped with the pixel electrodes of the second subpixels in the first pixel groups, respectively.

17. The display substrate according to claim 16, wherein, in the direction perpendicular to the base substrate, the conduction regions of the compensation transistors of the second subpixels and the third subpixels in the third pixel groups are respectively overlapped with the pixel electrodes of the third subpixels in the first pixel groups;

each pixel electrode of the third subpixels in the first pixel groups comprises an electrode main body and a first electrode protrusion and a second electrode protrusion extending out from the third electrode main body; and in the direction perpendicular to the base substrate, the first protrusions and the second protrusions are respectively at least partially overlapped with the conduction regions of the compensation transistors of the second subpixels and the third subpixels in the third pixel groups.

18. The display substrate according to claim 16, wherein the conduction regions of the compensation transistors of each first subpixel and each second subpixel in the fourth pixel groups are at least partially overlapped with corresponding pixel electrodes of the second subpixels in the second pixel groups; and wherein a minimum spacing between the electrode main bodies of the pixel electrodes of the third subpixels in the first pixel groups and the third pixel groups is smaller than a minimum spacing between the electrode main bodies of the pixel electrodes of the third subpixels in the second pixel groups and the fourth pixel groups.

19. The display substrate according to claim 18, wherein each pixel electrode of the second subpixels in the second pixel groups comprises an electrode main body and a third electrode protrusion and a fourth electrode protrusion extending out from the electrode main body; and in the direction perpendicular to the base substrate, the third electrode protrusions and the fourth electrode protrusions are respectively at least partially overlapped with the conduction regions of the compensation transistors of the first subpixels and the second subpixels in the fourth pixel groups.

20. A display device, comprising the display substrate according to claim 1.

* * * * *